US011257929B2

(12) United States Patent
Morrow et al.

(10) Patent No.: US 11,257,929 B2
(45) Date of Patent: Feb. 22, 2022

(54) STACKED TRANSISTORS

(71) Applicant: Intel Corporation, Santa Clara, CA (US)

(72) Inventors: Patrick Morrow, Portland, OR (US); Rishabh Mehandru, Portland, OR (US); Aaron D. Lilak, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/770,463

(22) PCT Filed: Dec. 18, 2015

(86) PCT No.: PCT/US2015/066889
§ 371 (c)(1),
(2) Date: Apr. 23, 2018

(87) PCT Pub. No.: WO2017/105515
PCT Pub. Date: Jun. 22, 2017

(65) Prior Publication Data

US 2018/0315838 A1 Nov. 1, 2018

(51) Int. Cl.
*H01L 27/00* (2006.01)
*H01L 29/66* (2006.01)
(Continued)

(52) U.S. Cl.
CPC .... *H01L 29/66795* (2013.01); *H01L 21/8221* (2013.01); *H01L 21/823842* (2013.01);
(Continued)

(58) Field of Classification Search
CPC .......... H01L 29/66795; H01L 21/8221; H01L 21/823842; H01L 21/823871;
(Continued)

(56) References Cited

U.S. PATENT DOCUMENTS

| | | | |
|---|---|---|---|
| 7,969,776 | B2 | 6/2011 | Juengling |
| 8,536,023 | B2 | 9/2013 | Or-Bach et al. |

(Continued)

FOREIGN PATENT DOCUMENTS

| | | |
|---|---|---|
| KR | 10-2011-0004415 | 1/2011 |
| TW | 201133849 | 10/2011 |

(Continued)

OTHER PUBLICATIONS

International Search Report and Written Opinion for International Patent Application No. PCT/US2015/066889 dated Oct. 31, 2016, 13 pgs.

(Continued)

*Primary Examiner* — Mounir S Amer
*Assistant Examiner* — Alexander Belousov
(74) *Attorney, Agent, or Firm* — Schwabe, Williamson & Wyatt, P.C.

(57) ABSTRACT

A first interconnect layer is bonded to a first substrate. The first interconnect layer is deposited on a first device layer on a second device layer on a second substrate. The second device layer is revealed from the second substrate side. A first insulating layer is deposited on the revealed second device layer. A first opening is formed in the first insulating layer to expose a first portion of the second device layer. A contact region is formed on the exposed first portion of the second device layer.

19 Claims, 32 Drawing Sheets

(51) Int. Cl.

| | |
|---|---|
| ***H01L 29/423*** | (2006.01) |
| ***H01L 29/786*** | (2006.01) |
| ***H01L 21/822*** | (2006.01) |
| ***H01L 21/8238*** | (2006.01) |
| ***H01L 27/06*** | (2006.01) |
| ***H01L 27/092*** | (2006.01) |
| *H01L 29/06* | (2006.01) |
| *H01L 27/088* | (2006.01) |
| *H01L 21/8234* | (2006.01) |

(52) U.S. Cl.
CPC .. *H01L 21/823871* (2013.01); *H01L 27/0688* (2013.01); *H01L 27/092* (2013.01); *H01L 29/42392* (2013.01); *H01L 29/66439* (2013.01); *H01L 29/66545* (2013.01); *H01L 29/78696* (2013.01); *H01L 21/823475* (2013.01); *H01L 27/088* (2013.01); *H01L 29/0673* (2013.01)

(58) Field of Classification Search
CPC ............... H01L 27/0688; H01L 27/092; H01L 29/66545; H01L 21/823475; H01L 29/0673
See application file for complete search history.

(56) References Cited

U.S. PATENT DOCUMENTS

| | | | |
|---|---|---|---|
| 2007/0018166 A1 | 1/2007 | Atanackovic | |
| 2012/0091587 A1 | 4/2012 | Or-Bach et al. | |
| 2012/0220102 A1 | 8/2012 | Or-Bach et al. | |
| 2013/0043531 A1 | 2/2013 | Juengling | |
| 2014/0035041 A1* | 2/2014 | Pillarisetty ........ H01L 29/42392 | 257/365 |
| 2014/0209865 A1* | 7/2014 | Pillarisetty ........ H01L 29/66795 | 257/29 |
| 2015/0348945 A1 | 12/2015 | Or-Bach et al. | |
| 2016/0197069 A1* | 7/2016 | Morrow .......... H01L 21/823431 | 257/393 |

FOREIGN PATENT DOCUMENTS

| | | |
|---|---|---|
| TW | 201203326 | 1/2012 |
| TW | 201338054 | 9/2013 |
| TW | 201436235 | 9/2014 |
| TW | 201511224 | 3/2015 |
| WO | WO-2014209278 | 12/2014 |

OTHER PUBLICATIONS

Office Action from Taiwan Patent Application No. 105137105, dated Apr. 30, 2020, 10 pages.

International Preliminary Report on Patentability for International Patent Application No. PCT/US2015/066889, dated Jun. 28, 2018, 9 pgs.

Office Action from Taiwan Patent Application No. 105137105, dated Oct. 28, 2020, 14 pages.

Office Action from Taiwan Patent Application No. 105137105, dated Jan. 12, 2021 3 pages.

Office Action from Taiwan Patent Application No. 105137105, dated Dec. 7, 2021, 10 pages.

* cited by examiner

STACKED TRANSISTORS

CROSS-REFERENCE TO RELATED APPLICATION

This patent application is a U.S. National Phase Application under 35 U.S.C. § 371 of International Application No. PCT/US2015/066889, filed Dec. 18, 2015, entitled “STACKED TRANSISTORS,” which designates the United States of America, the entire disclosure of which is hereby incorporated by reference in its entirety and for all purposes.

FIELD

Embodiments as described herein relate to a field of microelectronic device manufacturing, and in particular, to stacked devices manufacturing.

BACKGROUND

Decreasing the dimensions of semiconductor devices and increasing the level of their integration are two major trends in the current device manufacturing. As a result of these trends, the density of elements forming a semiconductor device increases. Scaling of the devices down to submicron dimensions requires the routine fabrication of the device elements at the submicron level that becomes more difficult due to physics challenges at small dimensions.

Generally, semiconductor structures forming semiconductor devices may be stacked on top of one another to increase the level of the device integration and reduce the device footprint. Typically, the stacked devices are interconnected vertically using vias that are a part of an interconnect structure. The interconnect structure includes one or more levels of metal lines to connect the electronic devices to one another and to external connections.

Traditionally, the transistors of the stacked transistor structure are manufactured independently. One of the conventional techniques involves building the transistors independently on two separate wafers and then bonding the wafers to stack the devices on top of one another. Another one of the conventional techniques involves sequentially building the transistors in layers on a single semiconductor wafer. Both conventional techniques require separate sets of the lithographical and other processing operations for each of the transistors that consumes time and is very expensive.

BRIEF DESCRIPTION OF THE DRAWINGS

Embodiments of the invention may be best understood by referring to the following description and accompanying drawings that are used to illustrate embodiments of the invention. In the drawings.

DETAILED DESCRIPTION

Figure 1:
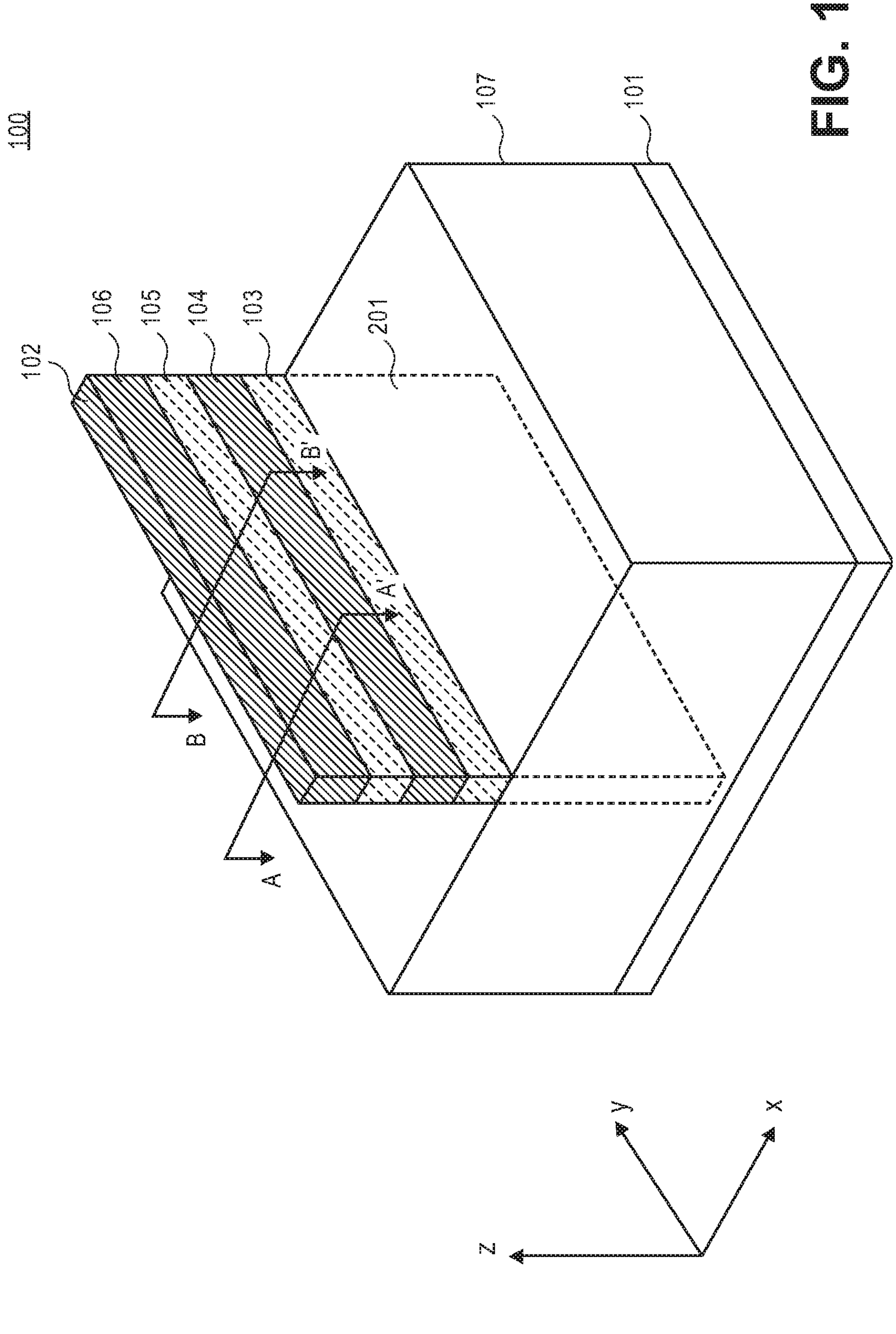
FIG. 1 shows a three-dimensional view of a portion of an electronic device according to one embodiment.

Methods and apparatuses to provide stacked devices are described. An interconnect layer is deposited on a first device layer on a second device layer on a backside substrate. The interconnect layer is bonded to a carrier substrate. The second device layer is revealed from the second substrate side. An insulating layer is deposited on the revealed second device layer. An opening is formed in the insulating layer to expose a portion of the second device layer. A source/drain region is formed on the exposed portion of the second device layer. In one embodiment, the first device layer on the second device layer are a part of a fin formed on the backside substrate. In one embodiment, an intermediate layer is deposited between the first device layer and the second device layer.

In one embodiment, the stacked device structure comprising an upper device layer on a lower device layer is manufactured by partially forming the lower device contact layers from the backside using a backside reveal process. The backside reveal enables forming a gate and the source/drain regions from the backside of the structure. In one embodiment, forming the contact regions of the device involves epitaxially growing a doped semiconductor layer on the contact region of the device layer from the backside of the structure. In another embodiment, forming the contact regions of the device from the backside involves adding a dopant to the contact region using an implantation technique from the backside of the structure. Backside fabrication of the stacked structure has an advantage over the conventional frontside techniques. The gate and source/drain regions of the lower device of the stacked transistor structure are impossible, or at the very least, difficult to fabricate with the conventional frontside techniques. Fabrication of the contact regions of the lower device layer, from the backside, advantageously simplifies the manufacturing process and reduces cost comparing with the conventional techniques.

In one embodiment, manufacturing the stacked device structure involves sharing the fin and gate patterning operations for the stacked devices. Sharing the fin and gate patterning operations for the stacked devices advantageously reduces the manufacturing cost comparing with the conventional techniques.

In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without specific details. In other instances, well-known features are omitted or simplified in order not to obscure the illustrative implementations.

Various operations will be described as multiple discrete operations, in turn, in a manner that is most helpful in understanding the present invention; however, the order of description should not be construed to imply that these operations are necessarily order dependent. In particular, these operations need not be performed in the order of presentation.

While certain exemplary embodiments are described and shown in the accompanying drawings, it is to be understood that such embodiments are merely illustrative and not restrictive, and that the embodiments are not restricted to the specific constructions and arrangements shown and described because modifications may occur to those ordinarily skilled in the art.

Reference throughout the specification to "one embodiment", "another embodiment", or "an embodiment" means that a particular feature, structure, or characteristic described in connection with the embodiment is included in at least one embodiment. Thus, the appearance of the phrases, such as "one embodiment" and "an embodiment" in various places throughout the specification are not necessarily all referring to the same embodiment. Furthermore, the particular features, structures, or characteristics may be combined in any suitable manner in one or more embodiments.

Moreover, inventive aspects lie in less than all the features of a single disclosed embodiment. Thus, the claims following the Detailed Description are hereby expressly incorporated into this Detailed Description, with each claim standing on its own as a separate embodiment. While the exemplary embodiments have been described herein, those skilled in the art will recognize that these exemplary embodiments can be practiced with modification and alteration as described herein. The description is thus to be regarded as illustrative rather than limiting.

Figures 1A, 1B, 1C:
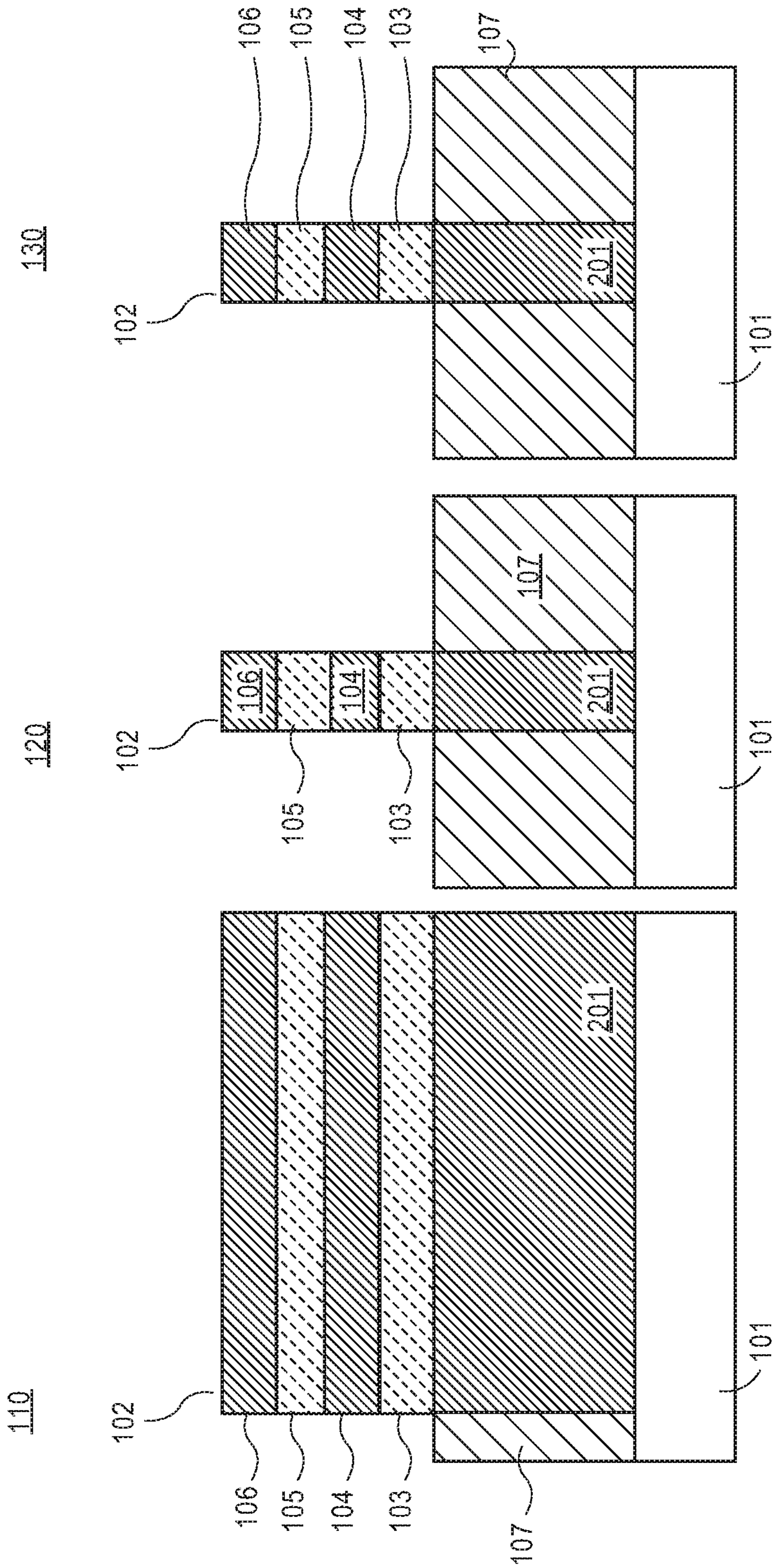
FIG. 1A shows a side view of the portion of the electronic device shown in FIG. 1 along a plane YZ according to one embodiment.
FIG. 1B shows a cross-sectional view of the portion of the electronic device shown in FIG. 1 along an A-A' axis according to one embodiment.
FIG. 1C shows a cross-sectional view of the portion of the electronic device shown in FIG. 1 along a B-B' axis according to one embodiment.

FIG. 1 shows a three-dimensional view of a portion of an electronic device 100 according to one embodiment. FIG. 1A shows a side view 110 of the portion of the electronic device 100 shown in FIG. 1 along a plane YZ according to one embodiment. FIG. 1B shows a cross-sectional view 120 of the portion of the electronic device 100 along an A-A' axis. FIG. 1C shows a cross-sectional view 130 of the portion of the electronic device 100 along a B-B' axis. As shown in FIGS. 1, 1A, 1B, and 1C, electronic device 100 comprises a fin 102 on a substrate 101. In one embodiment, substrate 101 is a backside substrate.

In an embodiment, the substrate 101 comprises a semiconductor material, e.g., silicon (Si). In one embodiment, substrate 101 is a monocrystalline Si substrate. In another embodiment, substrate is a polycrystalline Si substrate. In yet another embodiment, substrate 101 is an amorphous Si substrate. In alternative embodiments, substrate 101 includes silicon, germanium ("Ge"), silicon germanium ("SiGe"), a III-V materials based material e.g., gallium arsenide ("GaAs"), or any combination thereof. In one embodiment, the substrate 101 includes metallization interconnect layers for integrated circuits. In at least some embodiments, the substrate 101 includes electronic devices, e.g., transistors, memories, capacitors, resistors, optoelectronic devices, switches, and any other active and passive electronic devices that are separated by an electrically insulating layer, for example, an interlayer dielectric, a trench insulation layer, or any other insulating layer known to one of ordinary skill in the art of the microelectronic device manufacturing. In at least some embodiments, the substrate 101 includes interconnects, for example, vias, configured to connect the metallization layers.

In an embodiment, substrate 101 is a semiconductor-on-isolator (SOI) substrate including a bulk lower substrate, a middle insulation layer, and a top monocrystalline layer. The top monocrystalline layer may comprise any material listed above, e.g., silicon.

In various implementations, the substrate 100 can be, e.g., an organic, a ceramic, a glass, or a semiconductor substrate. In one implementation, the substrate 100 may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which passive and active electronic devices (e.g., transistors, memories, capacitors, inductors, resistors, switches, integrated circuits, amplifiers, optoelectronic devices, or any other electronic devices) may be built falls within the spirit and scope of the present invention.

As shown in FIGS. 1,1A, 1B, and 1C, fin 102 comprises a stack of a device layer 106 on an intermediate layer 105 on a device layer 104 on an intermediate layer 103 on a base 201. In alternative embodiments, fin 102 comprises a stack of more than two device layers on top of each other that are separated by the intermediate layers. In one embodiment, an insulating layer (e.g., an oxide) (not shown) is deposited between intermediate layer 103 and base 201. In one embodiment, base 201 is a part of the substrate 101. In one embodiment, base 201 comprises the same material as that of the substrate 101. In one embodiment, base 201 is silicon. In another embodiment, base 201 comprises the material that is different from that of the substrate 101. As shown in FIGS. 1, 1A, 1B, and 1C, fin 102 comprises a top portion and opposing sidewalls. The fin 102 has a width along an X axis, a length along an Y axis and a height along a Z axis. In one embodiment, the width of the fin 102 defines the width of the transistor, or other electronic device formed later on in a process. In one embodiment, the width of the fin 102 is from about 1 nanometers (nm) to about 20 nm. In more specific embodiment, the width of the fin 102 is from about 4 nm to about 15 nm. In one embodiment, the height of the fin 102 is at least twice greater than the width and is determined by design. In one embodiment, the length of the fin 102 is greater than the width and is determined by design. In one embodiment, the length of the fin 102 is from about 10 nm to hundreds of microns.

In one embodiment, each of the device layers 104 and 106 is a layer on which a transistor, or other electronic device, is formed later on in a process. In one embodiment, fin 102 comprising a stack of at least two transistors, or other devices is defined using a single lithographical operation. In one embodiment, the material of each of the device layers 104 and 106 is different from the material of each of the intermediate layers 103 and 105. The device layers 104 and 106 can be formed of any semiconductor material, such as but not limited to silicon (Si), germanium (Ge), silicon germanium ($Si_x Ge_y$), a III-V material, e.g., gallium arsenide (GaAs), InSb, GaP, GaSb, carbon nanotubes, other material to fabricate an electronic device, or any combination thereof. In one embodiment, each of the intermediate layers 103 and 105 is a sacrificial layer that is removed later on in a process. In one embodiment, each of the intermediate layers 103 and 105 is a silicon germanium (SiGe) layer. In one embodiment, each of the intermediate layers 103 and 105 is an insulating layer, e.g., a low-k interlayer dielectric (ILD) layer. In alternate embodiments, each of the intermediate layers 103 and 105 is an oxide layer, e.g., a silicon oxide layer, an aluminum oxide, a carbon doped oxide (e.g., a carbon doped silicon oxide), a carbon layer, or any combination thereof. In another embodiment, each of the intermediate layers 103 and 105 is a polymer layer, or other sacrificial layer. In more specific embodiment, each of the device layers 104 and 106 is a silicon layer and each of the intermediate layers 103 and 105 is a silicon germanium layer. In one embodiment, the thickness of each of the device layers 104 and 106 is from about 5 nm to about 100 nm. In one embodiment, the thickness of each of the intermediate layers 103 and 105 is from about 1 nm to about 20 nm.

In one embodiment, each of the device layers 106 and 104 is deposited using one or more deposition techniques, such as but not limited to, a chemical vapour deposition ("CVD"), e.g., a plasma Enhanced chemical vapour deposition ("PECVD"), a physical vapour deposition ("PVD"), molecular beam epitaxy ("MBE"), metalorganic chemical vapor deposition ("MOCVD"), atomic layer deposition ("ALD"), or other deposition techniques known to one of ordinary skill in the art of microelectronic device manufacturing. In one embodiment, each of the intermediate layers 105 and 103 is deposited using one or more deposition techniques, such as but not limited to, a chemical vapour deposition ("CVD"), e.g., a plasma enhanced chemical vapour deposition ("PECVD"), a physical vapour deposition ("PVD"), molecular beam epitaxy ("MBE"), metalorganic chemical vapor deposition ("MOCVD"), atomic layer deposition ("ALD"), or other deposition techniques known to one of ordinary skill in the art of microelectronic device manufacturing.

In one embodiment, the fin 102 is fabricated using one or more patterning and etching techniques known to one of ordinary skill in the art of microelectronic device manufacturing.

As shown in FIGS. 1, 1A, 1B and 1C, an insulating layer 107 is deposited on substrate 101. In one embodiment, insulating layer 107 is an interlayer dielectric (ILD) layer. In one embodiment, insulating layer 107 is an oxide layer, e.g., a silicon oxide layer. In one embodiment, insulating layer 107 is a low-k dielectric, e.g., silicon dioxide, silicon oxide, carbon doped oxide ("CDO"), or any combination thereof. In one embodiment, insulating layer 107 includes a nitride, oxide, a polymer, phosphosilicate glass, fluorosilicate ("SiOF") glass, organosilicate glass ("SiOCH"), or any combination thereof. In another embodiment, insulating layer 107 is a nitride layer, e.g., silicon nitride layer. In alternative embodiments, insulating layer 107 is an aluminum oxide, silicon oxide nitride, other oxide/nitride layer, any combination thereof, or other electrically insulating layer determined by an electronic device design.

In one embodiment, the thickness of the insulating layer 107 determines the height of the gate formed later on in a process. In one embodiment, the insulating layer 107 is deposited to the thickness that is similar to the height of the portion 201. In one embodiment, the thickness of the insulating layer 107 is determined by design. In one embodiment, the insulating layer 107 is deposited to the thickness from about 10 nanometers (nm) to about 2 microns (μm). In an embodiment, the insulating layer 107 is deposited on the fin 102 and the exposed portions of the substrate 101 using one of deposition techniques, such as but not limited to a chemical vapour deposition ("CVD"), e.g., a plasma enhanced chemical vapour deposition ("PECVD"), a physical vapour deposition ("PVD"), molecular beam epitaxy ("MBE"), metalorganic chemical vapor deposition ("MOCVD"), atomic layer deposition ("ALD"), spin-on, or other deposition techniques known to one of ordinary skill in the art of microelectronic device manufacturing. In an embodiment, the insulating layer is recessed to a predetermined thickness to expose device layer 106 on intermediate layer 105 on device layer 104 on intermediate layer 103 using one of etching techniques known to one of ordinary skill in the art of microelectronic device manufacturing.

Figure 2:
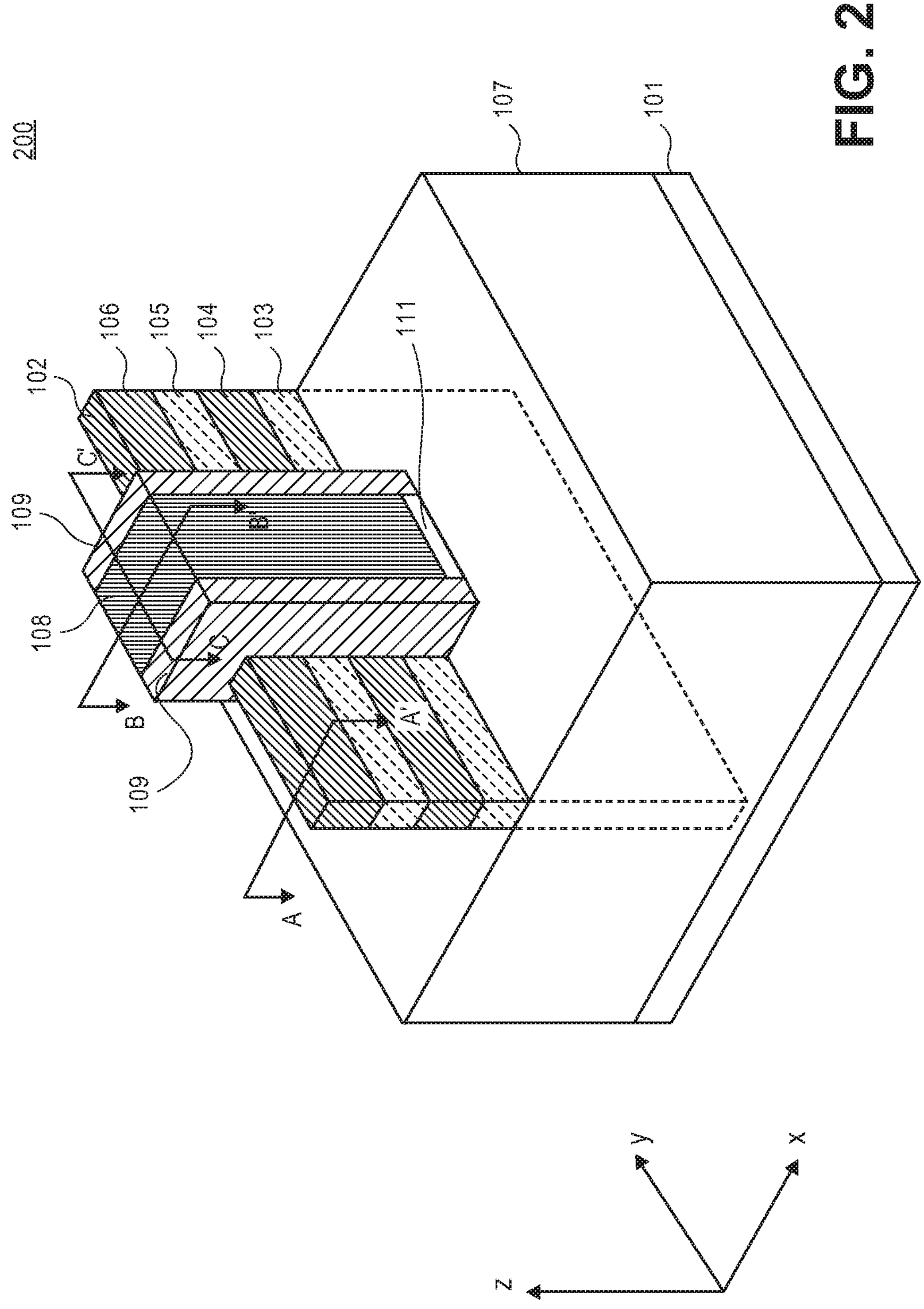
FIG. 2 is a view similar to FIG. 1 after a replacement gate and spacers are formed on the fin according to one embodiment.
Figures 2A, 2B, 2C:
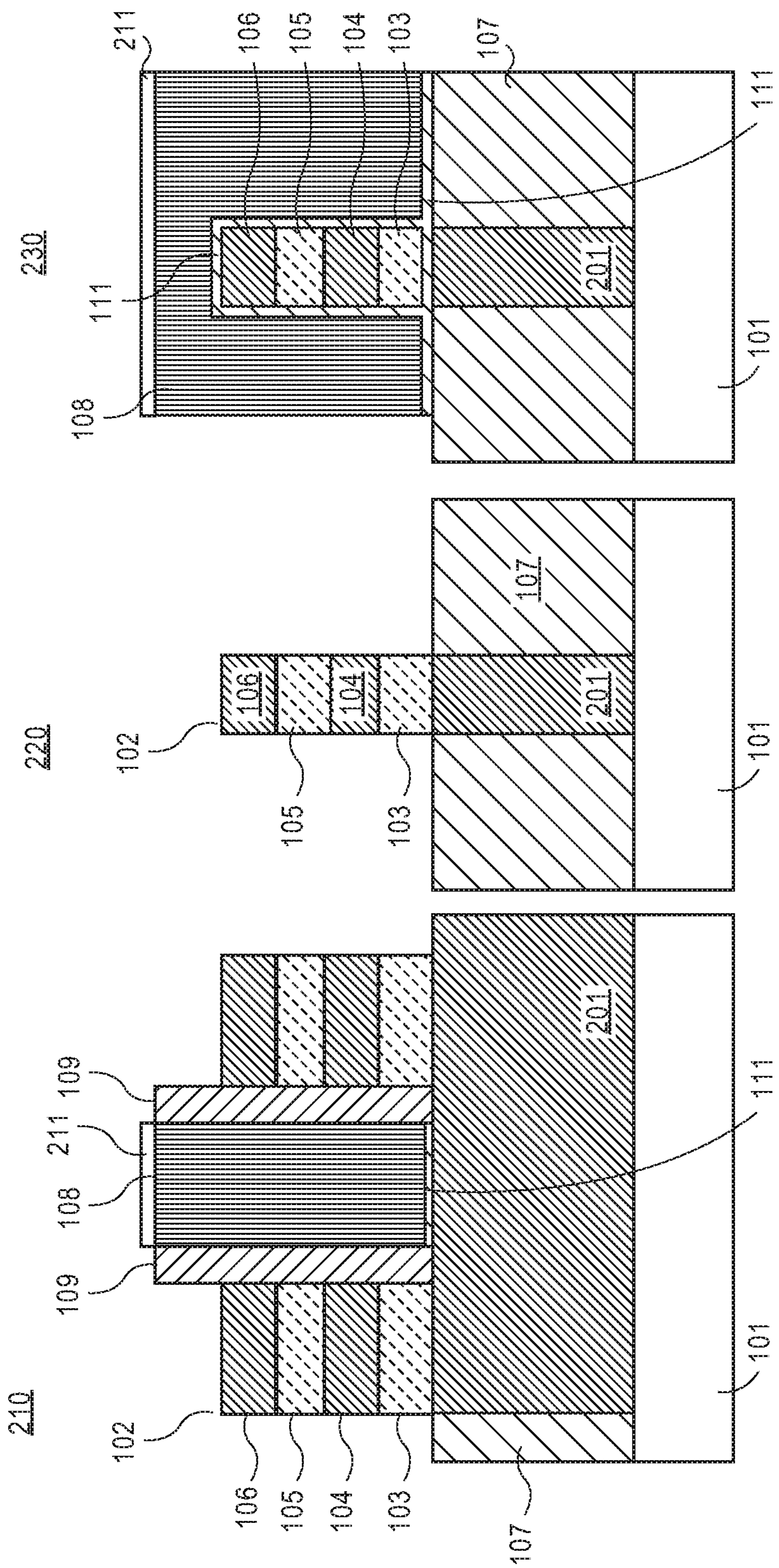
FIG. 2A is a side view of the portion of the electronic device shown in FIG. 2 along a plane YZ according to one embodiment.
FIG. 2B is a cross-sectional view of the portion of the electronic device shown in FIG. 2 along A-A' axis according to one embodiment.
FIG. 2C is a cross-sectional view of the portion of the electronic device shown in FIG. 2 along a B-B' axis according to one embodiment.

FIG. 2 is a view 200 similar to FIG. 1 after a replacement (sacrificial) gate 108 and spacers 109 are formed on the fin 102 according to one embodiment. FIG. 2A is a side view 210 of the portion of the electronic device shown in FIG. 2 along plane YZ according to one embodiment. FIG. 2B is a cross-sectional view 220 of the portion of the electronic device shown in FIG. 2 along A-A' axis. FIG. 2C is a cross-sectional view 230 of the portion of the electronic device 100 along B-B' axis. As shown in FIGS. 2, 2A, 2B, and 2C, an insulating layer 111 is deposited on the fin 105. An axis C-C' extends through the gate along the length of the fin 102. Insulating layer 111 is deposited on the top portion and opposing sidewalls of the portion of the fin 102 on which a gate is formed later on in a process. In one embodiment, insulating layer 111 is an oxide layer, e.g., a silicon oxide layer, an aluminum oxide, a carbon doped oxide (e.g., a carbon doped silicon oxide), a carbon layer, or any combination thereof. In one embodiment, the thickness of the insulating layer 111 is from about 2 angstroms (Å) to about 20 Å.

In alternative embodiments, insulating layer 111 is deposited using one of deposition techniques, such as but not limited to, a chemical vapour deposition ("CVD"), e.g., a plasma enhanced chemical vapour deposition ("PECVD"), a physical vapour deposition ("PVD"), molecular beam epitaxy ("MBE"), metalorganic chemical vapor deposition ("MOCVD"), atomic layer deposition ("ALD"), spin-on, or other deposition techniques known to one of ordinary skill in the art of microelectronic device manufacturing. Insulating layer 111 is patterned and etched using one or more patterning and etching techniques known to one of ordinary skill in the art of microelectronic device manufacturing.

Replacement gate 108 is formed on the oxide layer 111. In one embodiment, the replacement gate 108 for a stack of at least two transistors or other devices is defined using a single lithographical operation. In one embodiment, replacement gate 108 is a polysilicon gate, or any other replacement gate. In one embodiment, replacement gate 108 is formed by patterning and etching a hard mask 211 on the gate layer (e.g., polysilicon, or other material gate layer) using one or more patterning and etching techniques known to one of ordinary skill in the art of microelectronic device manufacturing. In alternative embodiments, hard mask 211 is an oxide hard mask, a nitride hard mask, a silicon carbide hard mask, or any other hard mask known to one of ordinary skill in the art of microelectronic device manufacturing. Spacers 109 are formed on the opposite sidewalls of the replacement gate 108 by using one of the spacer deposition techniques known to one of ordinary skill of microelectronic device manufacturing. In one embodiment, spacers 109 are nitride spacers (e.g., silicon nitride), oxide spacers, carbide spacers (e.g., silicon carbide), or other spacers known to one of ordinary skill in the art of microelectronic device manufacturing. In one embodiment, spacers 109 are ultra-low k (k-value less than 2) material spacers.

Figures 3A, 3B, 3C:
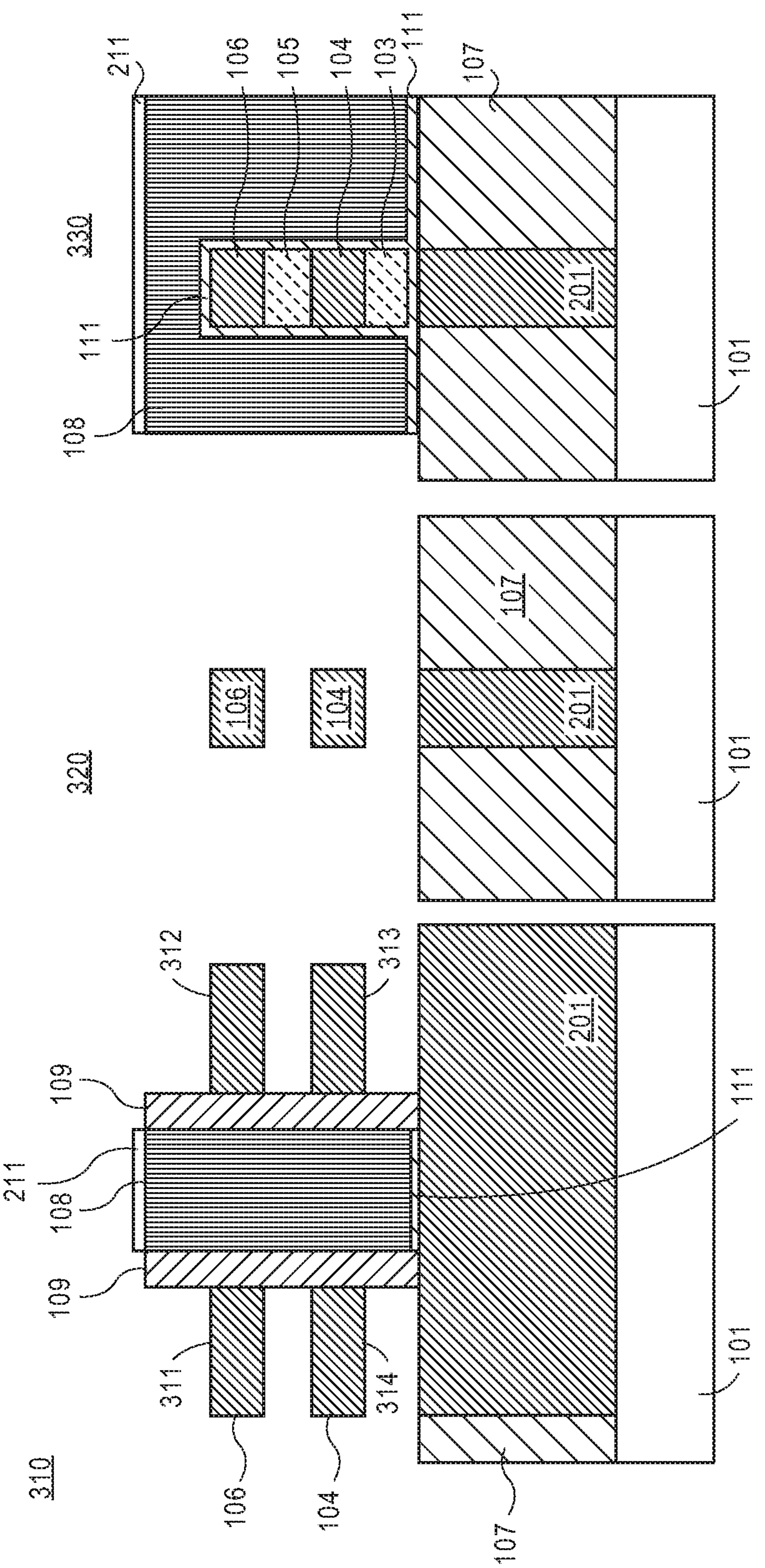
FIG. 3A is a view similar to FIG. 2A after portions of the intermediate layers are removed according to one embodiment.
FIG. 3B is a view similar to FIG. 2B after portions of the intermediate layers are removed according to one embodiment.
FIG. 3C is a view similar to FIG. 2C after portions of the intermediate layers are removed according to one embodiment.

FIG. 3A is a view 310 similar to FIG. 2A, FIG. 3B is a view 320 similar to FIG. 2B, and FIG. 3C is a view 330 similar to FIG. 2C after portions of the intermediate layers 103 and 105 are removed according to one embodiment. As shown in FIGS. 3A, 3B, and 3C, the portions of the intermediate layers 103 and 105 outside the replacement gate 108 and spacers 109 are selectively removed to expose portions 311, 312 of the device layer 106 and portions 314 and 313 of device layer 104. In one embodiment, the portions of the intermediate layers 103 and 105 outside the replacement gate 108 and spacers 109 are removed using an isotropic etching technique. In one embodiment, the intermediate layers 103 and 105 of SiGe are wet etched selectively for a predetermined time, in this case, there may be some amount of undercut in the fin region which needs to be controlled. In one embodiment, the intermediate layers 103 and 105 of SiGe are wet etched at an elevated temperature greater than a room temperature. In one embodiment, the portions 311, 312 of the device layer 106 are free standing portions of a nanowire. In one embodiment, the portions 314 and 313 of device layer 104 are free standing portions of a nanowire. In one embodiment, the portions 314 and 313 of device layer 104 represent a nanowire. As shown in FIG. 3C, the portions of the intermediate layers 103 and 105 underneath replacement gate 108 and spacers 109 remain substantially intact by etching.

Figures 4A, 4B, 4C:
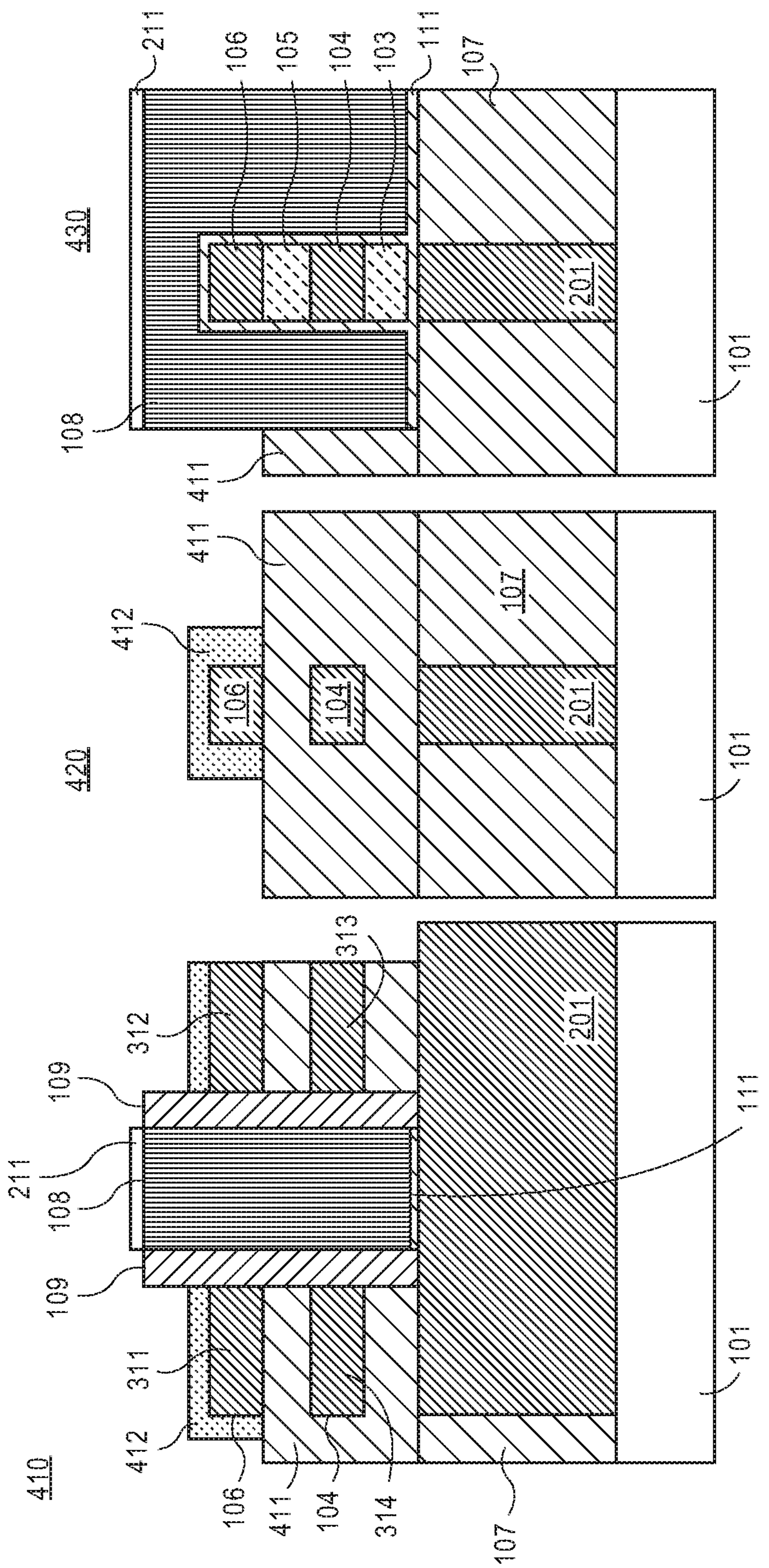
FIG. 4A is a view similar to FIG. 3A after an insulating layer and a doped layer are deposited according to one embodiment.
FIG. 4B is a view similar to FIG. 3B after an insulating layer and a doped layer are deposited according to one embodiment.
FIG. 4C is a view similar to FIG. 3C after an insulating layer and a doped layer are deposited according to one embodiment.

FIG. 4A is a view 410 similar to FIG. 3A, FIG. 4B is a view 420 similar to FIG. 3B, and FIG. 4C is a view 430 similar to FIG. 3C after an insulating layer 411 and a doped layer 412 are deposited according to one embodiment. Insulating layer 411 is deposited on the exposed portions of insulating layer 107 and exposed portions of the base 201. In one embodiment, insulating layer 411 is one of the insulating layers described above with respect to insulating layer 107. In alternative embodiments, the insulating layer 411 is deposited using one or more deposition techniques, such as but not limited to a chemical vapour deposition ("CVD"), e.g., a plasma enhanced chemical vapour deposition ("PECVD"), a physical vapour deposition ("PVD"), molecular beam epitaxy ("MBE"), metalorganic chemical vapor deposition ("MOCVD"), atomic layer deposition ("ALD"), or other deposition techniques known to one of ordinary skill in the art of microelectronic device manufacturing. In one embodiment, the insulating layer 411 is recessed to expose portions 311 and 312 of the device layer 106 outside the gate 108 and spacers 109 to form contact regions. In one embodiment, the portions 311 and 312 are source/drain regions, or other contact regions of the device layer 106. In one embodiment, doped layer 412 is epitaxially grown on the portions 311 and 312. In one embodiment, the concentration of the dopants in the doped layer 412 is greater than in the portions 311 and 312. In one embodiment, the doped layer 412 is an n-type semiconductor layer. In another embodiment, the doped layer 412 is a p-type semiconductor layer. In one embodiment, the doped layer 412 is a silicon layer. In one embodiment, the doped layer 412 is a p-type silicon layer comprising p-type dopants, e.g., boron, aluminum, nitrogen, gallium, indium, or any combination thereof. In one embodiment, the doped layer 412 is an n-type silicon layer comprising n-type dopants, e.g., phosphorous, arsenic, bismuth, lithium, or any combination thereof. In alternative embodiments, the doped layer 412 is a silicon, germanium, silicon germanium, III-V materials based layer, or any combination thereof. In one embodiment, the thickness of the doped layer 412 is from about 10 nm to about 50 nm.

In alternative embodiments, the doped layer 412 is selectively deposited on the exposed portions 311 and 312 using one or more deposition techniques, such as but not limited to a chemical vapour deposition ("CVD"), e.g., a plasma enhanced chemical vapour deposition ("PECVD"), a physical vapour deposition ("PVD"), molecular beam epitaxy ("MBE"), metalorganic chemical vapor deposition ("MOCVD"), atomic layer deposition ("ALD"), or other deposition techniques known to one of ordinary skill in the art of microelectronic device manufacturing.

In one embodiment, the doped layer 412 is annealed at an elevated temperature greater than a room temperature for a predetermined time to drive the dopants into the regions 311 and 312 to form the source/drains. In one embodiment, the doped layer 412 is annealed at the temperature from about 800 degrees C. to about 1200 degrees C. for about 0.25 seconds or less.

In one embodiment, after the annealing the doped layer 412 is removed using one or more of the doped layer removal techniques such as but not limited to chemical mechanical polishing (CMP), etching, or both.

Figures 5A, 5B, 5C:
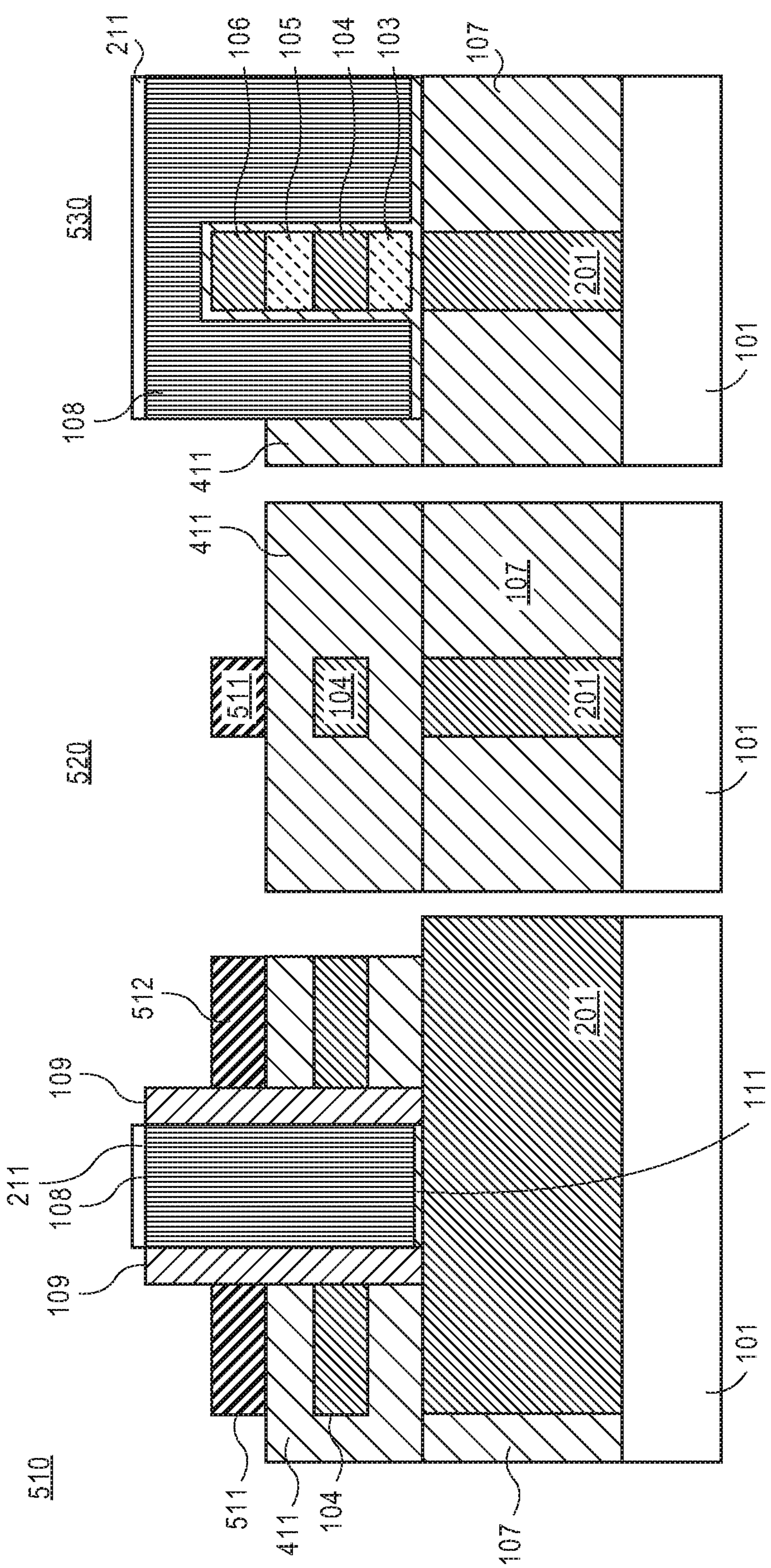
FIG. 5A is a view similar to FIG. 3A after depositing an insulating layer and adding dopants to the exposed portions of the device layer to form source/drain regions according to another embodiment.
FIG. 5B is a view similar to FIG. 3B after depositing an insulating layer and adding dopants to the exposed portions of the device layer to form source/drain regions according to another embodiment.
FIG. 5C is a view similar to FIG. 3C after depositing an insulating layer and adding dopants to the exposed portions of the device layer to form source/drain regions according to another embodiment.

FIG. 5A is a view 510 similar to FIG. 3A, FIG. 5B is a view 520 similar to FIG. 3B, and FIG. 5C is a view 530 similar to FIG. 3C after depositing insulating layer 411 and adding dopants to the exposed portions 311 and 312 of the device layer 106 to form a source/drain region 511 and a source/drain region 512 according to another embodiment. In one embodiment, the dopants are added to the exposed portions 311 and 312 using one of implantation techniques known to one of ordinary skill in the art of microelectronic device manufacturing. In one embodiment, the dopants added to the exposed portions 311 and 312 are n-type dopants. In another embodiment, the dopants added to the exposed portions 311 and 312 are p-type dopants.

Figures 6A, 6B, 6C:
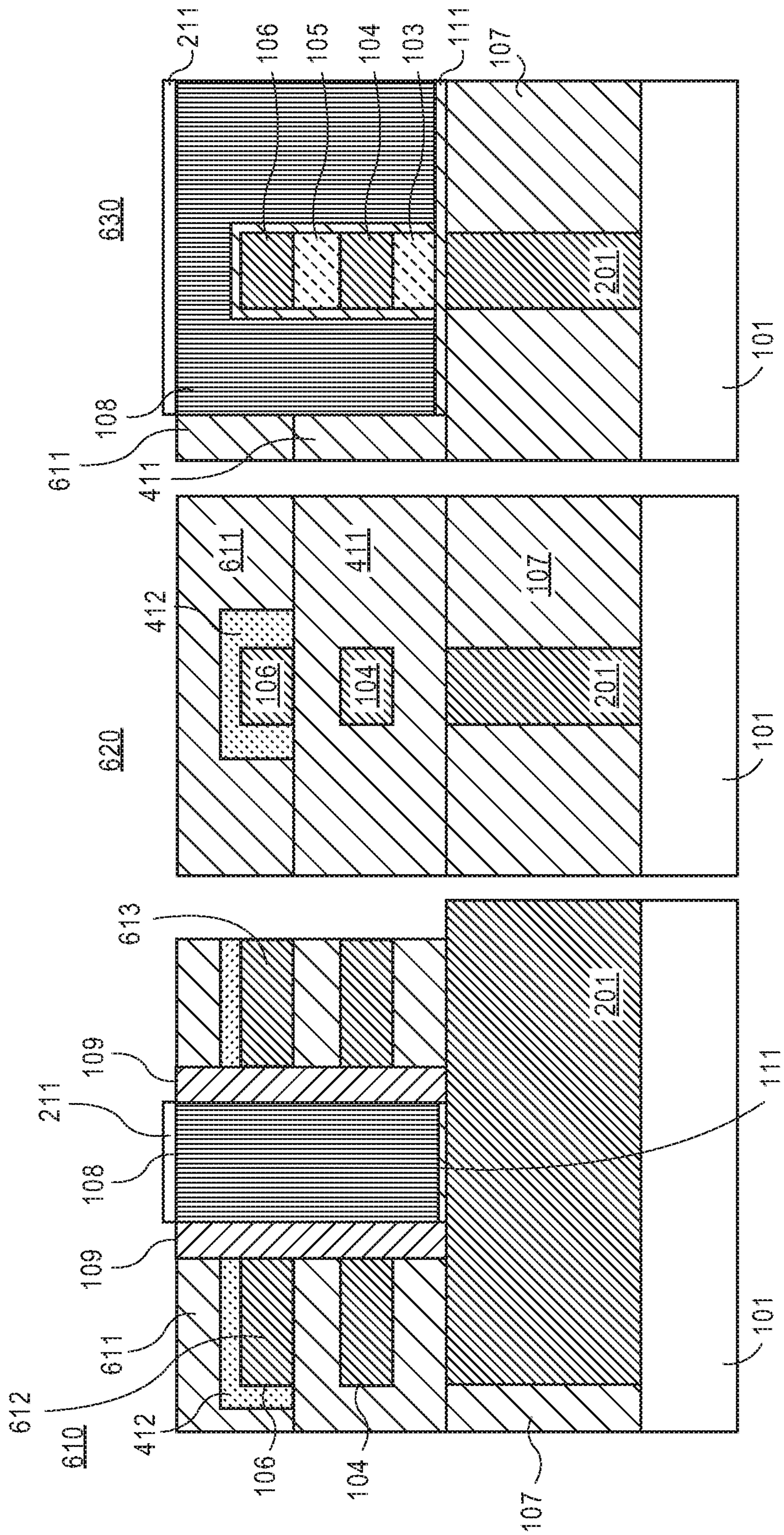
FIG. 6A is a view similar to FIG. 4A after an insulating layer is deposited on the doped layer according to one embodiment.
FIG. 6B is a view similar to FIG. 4B after an insulating layer is deposited on a doped layer according to one embodiment.
FIG. 6C is a view similar to FIG. 4C after an insulating layer is deposited on a doped layer according to one embodiment.

FIG. 6A is a view 610 similar to FIG. 4A, FIG. 6B is a view 620 similar to FIG. 4B, and FIG. 6C is a view 630 similar to FIG. 4C after an insulating layer 611 is deposited on doped layer 412 according to one embodiment. In one embodiment, insulating layer 611 is one of the insulating layers described above with respect to insulating layers 107 and 411. In one embodiment, insulating layer 611 is deposited using one of the techniques described above with respect to insulating layers 107 and 411.

Figures 7A, 7B, 7C:
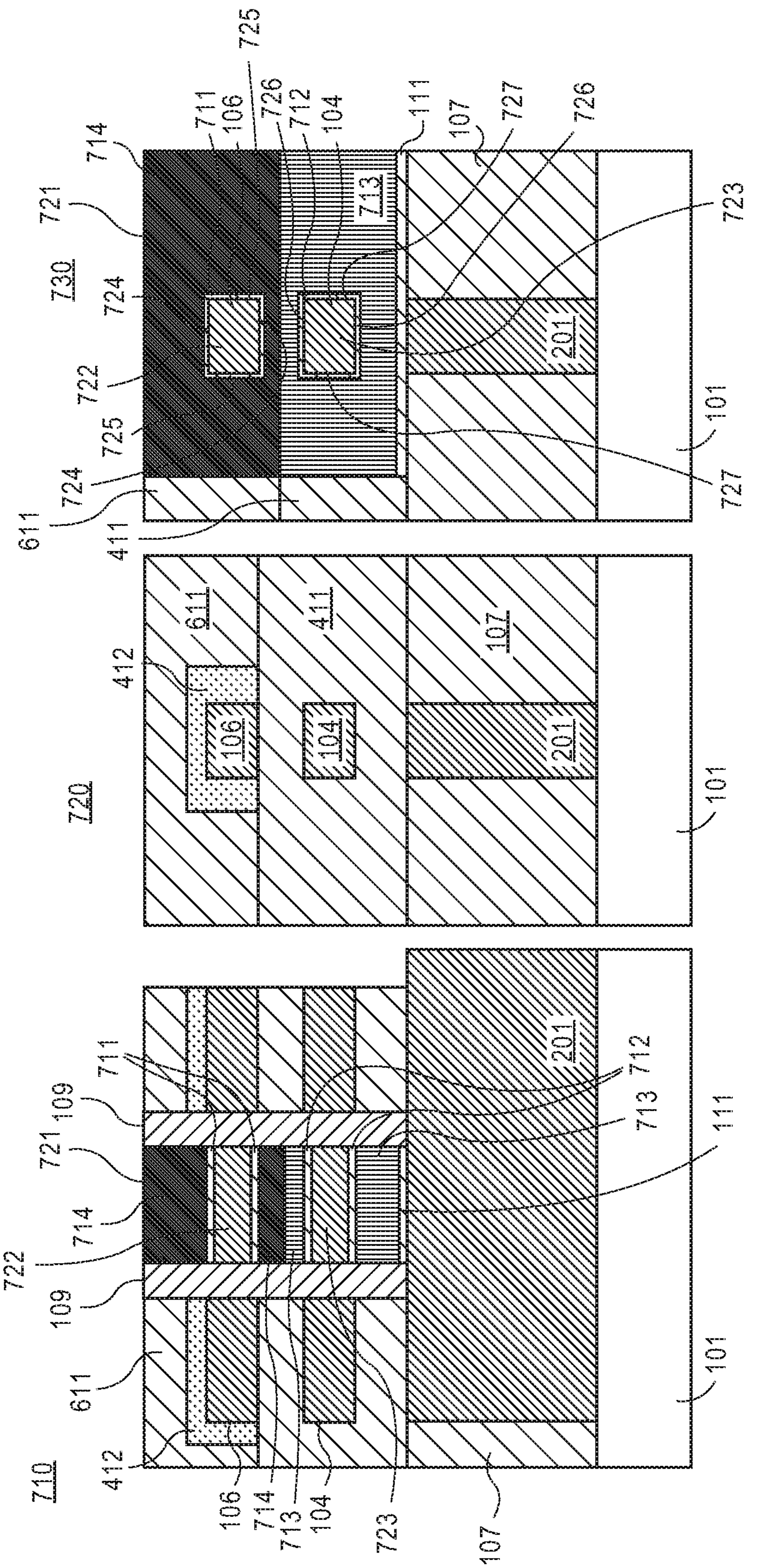
FIG. 7A is a cross-sectional view of the portion of the electronic device shown in FIG. 6A after removing the replacement gate and depositing a metal gate according to one embodiment.
FIG. 7B is a view similar to FIG. 6B after removing the replacement gate and depositing a metal gate according to one embodiment.
FIG. 7C is a view similar to FIG. 7C after removing the replacement gate and depositing a metal gate according to one embodiment.

FIG. 7A is a cross-sectional view 710 of the portion of the electronic device shown in FIG. 6A after removing the replacement gate 108 and depositing a metal gate 721 according to one embodiment. View 710 is the view through the metal gate 721 along the C-C' axis shown in FIG. 3. FIG. 7B is a view 720 similar to FIG. 6B, and FIG. 7C is a view 720 similar to FIG. 7C after removing the replacement gate 108 and depositing metal gate 721 according to one embodiment. In one embodiment, the hard mask 211 and replacement gate 108 are removed using one of the hard mask and replacement gate removal techniques known to one of ordinary skill in the art of microelectronic device manufacturing. As shown in FIG. 7C, the remaining portions of the intermediate layers 103 and 105 are also removed. In one embodiment, the remaining portions of the intermediate layers 103 and 105 are removed using one of the etching techniques, as described above.

As shown in FIGS. 7A and 7C, metal gate 721 comprises a metal gate 714 on a metal gate 713. Metal gate 714 is deposited on a portion 722 of the device layer 106. Metal gate 713 is deposited on a portion 723 of the device layer 104. As shown in FIG. 7C, portion 722 of the device layer 106 has opposing sidewalls 724 and opposing sidewalls 725. Portion 723 of the device layer 104 has opposing sidewalls 726 and opposing sidewalls 727. As shown in FIG. 7C, metal gate 714 is deposited on a gate oxide layer 711 on all sidewalls 724 and 725. Metal gate 713 is deposited on a gate oxide layer 712 on all sidewalls 726 and 727. In one embodiment, each of the metal gates 714 and 713 has a work function that corresponds to the transistor body. In one embodiment, the metal of the gate 714 is a p-gate work function metal, e.g., titanium, aluminum, gold, molybdenum, other metal, or other metal alloy having a p-gate work function, and metal of the gate 713 is an n-gate work function metal that includes, e.g., titanium, molybdenum, platinum, other metal, or other metal alloy having a p-gate work function, or vise versa. In alternative embodiments, metal nitrides, metal carbides, metal silicides, metal aluminides, hafnium, zirconium, titanium, tantalum, aluminum, ruthenium, palladium, platinum, cobalt, nickel, gold, conductive metal oxides, or any combination thereof, are used as n and p gate metals and tungsten is used as a gate fill material. In one embodiment, an actual work function for each of the metal gates is tuned to a p-gate work function or a n-gate work function using a respective combination of metals, metal alloys, or both. In another embodiment, the metal of the gates 714 and 713 is the same. That is, a stack of at least two transistors comprising metal gate 714 on metal gate 713 is formed based on a single fin 102 using a single lithographic al operation.

In one embodiment, each of the oxide layers 711 and 712 is a high-k gate oxide layer, e.g., a silicon oxide layer, an aluminum oxide, a carbon doped oxide (e.g., a carbon doped silicon oxide), or any other high-k oxide layer. In one embodiment, the thickness of each of the oxide layers 711 and 712 is from about 2 angstroms (Å) to about 20 Å. In alternative embodiments, each of the oxide layers is deposited using one of the oxide layer deposition techniques known to one of ordinary skill in the art of microelectronic device manufacturing. In one embodiment, metal gate 713 is deposited on the insulating layers 711 and 712. The metal gate 713 is recessed to expose insulating layer 711. In one embodiment, the metal gate 713 is recessed using etching, polishing, or a combination of thereof techniques, e.g., a chemical-mechanical polishing (CMP) technique known to one of ordinary skill in the art of microelectronic device manufacturing. The metal gate 714 is deposited on the recessed metal gate 714 and the exposed insulating layer 711.

In one embodiment, each of the metal gates 713 and 714 is deposited using one of the metal gate deposition techniques, e.g., electroplating, electroless plating, or other metal gate forming techniques known to one of ordinary skill in the art of microelectronic device manufacturing.

In one embodiment, the gate oxide includes e.g., titanium (Ti), aluminum (Al), hafnium (Hf), tantalum (Ta), tungsten (W), vanadium (V), molybdenum (Mo), palladium (Pd), gold (Au), silver (Au), platinum Pt, copper (Cu), ruthenium (Ru), nickel (Ni), cobalt (Co), chromium (Cr), iron (Fe), manganese (Mn), titanium nitride, tantalum nitride, zirconium, tin, lead, metal alloys, metal carbides, e.g., hafnium carbide, zirconium carbide, titanium carbide, tantalum carbide, aluminum carbide, other metals, or any combination thereof.

Figures 8A, 8B, 8C:
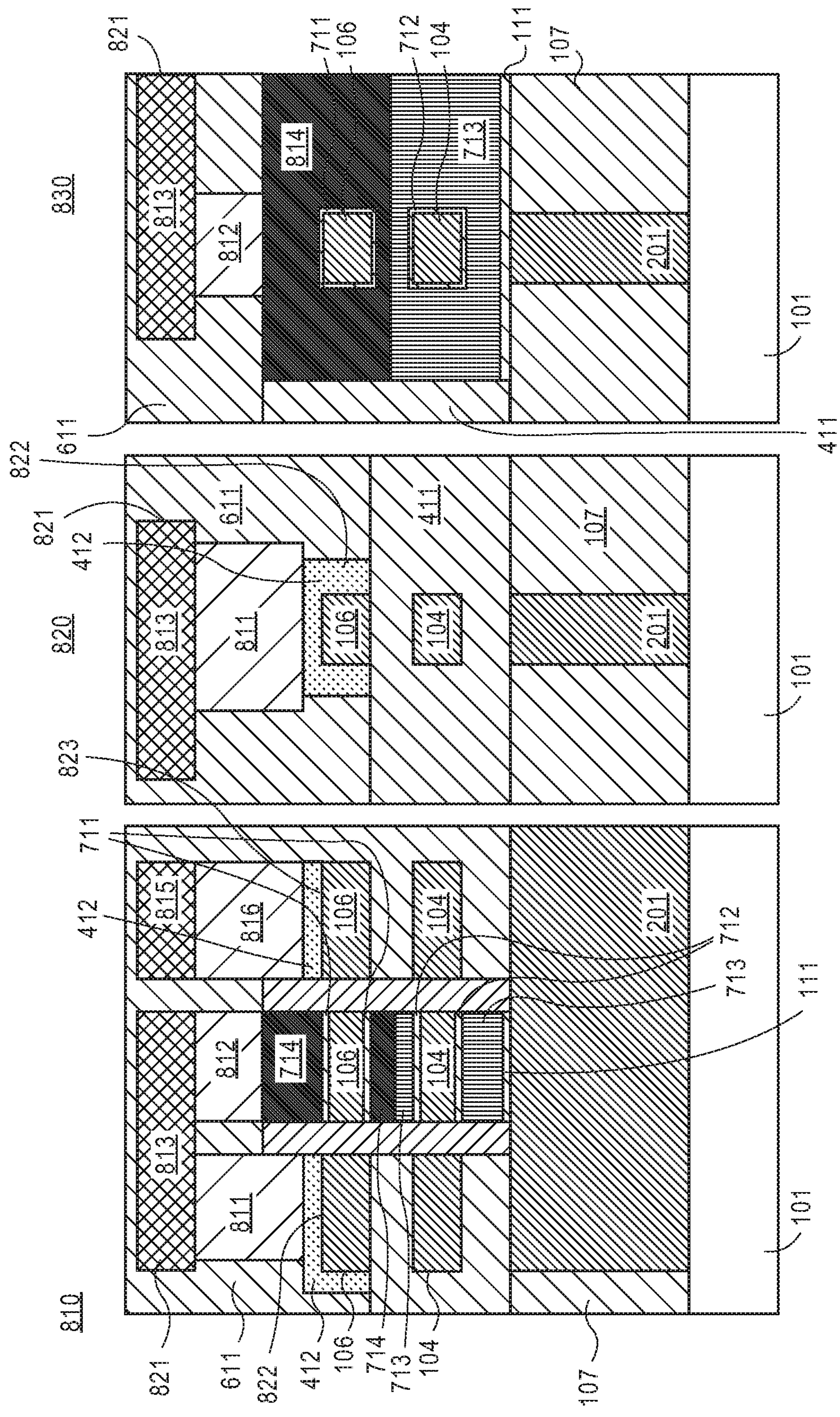
FIG. 8A is a view similar to FIG. 7A after an interconnect layer is deposited on the device layer according to one embodiment.
FIG. 8B is a view similar to FIG. 7B after an interconnect layer is deposited on the device layer according to one embodiment.
FIG. 8C is a view similar to FIG. 7C after an interconnect layer is deposited on the device layer according to one embodiment.

FIG. 8A is a view 810 similar to FIG. 7A, FIG. 8B is a view 820 similar to FIG. 7B, and FIG. 8C is a view 830 similar to FIG. 7C after an interconnect layer 821 is deposited on device layer 106 according to one embodiment. Interconnect layer 821 comprises conductive features 811, 812, 813, 815 and 816. A conductive feature 811 connects to a source/drain region 822 of the device layer 106 and a conductive feature 816 connects to a source/drain region 823 of the device layer 106. A conductive feature 812 connects to metal gate 714. In one embodiment, the conductive features 811, 812 and 816 are conductive vias, trenches, or other conductive features to connect the device layer to the features of the interconnect layer 821. Conductive feature 813 connects to conductive feature 811 and conductive feature 812. Conductive feature 815 connects to conductive feature 816. In one embodiment, conductive features 813 and 815 are conductive lines. In another embodiment, conductive features 813 and 815 are vias, trenches, or other conductive features. In one embodiment, openings are formed in the insulating layer 611 using the patterning and etching techniques known to one of ordinary skill in the art of microelectronic device manufacturing. One or more conductive layers, e.g., a conductive layer on a base layer are deposited to fill the openings in the insulating layer. One of chemical-mechanical polishing (CMP) techniques is used to remove the portions of the one or more conductive layers that extend above the top of the insulating layer 611. The portions of the one or more conductive layers deposited within the openings in the insulating layer 611 are not removed and become the patterned conductive features, such as conductive features 811, 812, 813, 815 and 816.

In one embodiment, the base layer includes a conductive seed layer deposited on a conductive barrier layer. In alternative embodiments, the seed layer is copper, titanium nitride, ruthenium, nickel, cobalt, tungsten, or any combination thereof. In one embodiment, the conductive barrier layer includes aluminum, titanium, titanium nitride, tantalum, tantalum nitride, tungsten, cobalt, ruthenium, the like metals, or any combination thereof. Generally, the conductive barrier layer is used to prevent diffusion of the conductive material from the seed layer into insulating layer 611 and to provide adhesion for the seed layer. Each of the conductive barrier layer and seed layer may be deposited using any thin film deposition technique known to one of ordinary skill in the art of semiconductor manufacturing, e.g., by sputtering, blanket deposition, and the like. In one embodiment, each of the conductive barrier layer and the seed layer has the thickness in the approximate range of 1 nanometers (nm) to 100 nm. In one embodiment, the barrier layer may be a thin dielectric that has been etched to establish conductivity to the metal layer below. In one embodiment, the barrier layer may be omitted altogether and appropriate doping of the copper line may be used to make a "self-forming barrier".

In one embodiment, the conductive layer of copper is deposited onto the seed layer of copper by an electroplating process. In another embodiment, the conductive layer is deposited onto the seed layer using one of selective deposition techniques known to one of ordinary skill in the art of semiconductor manufacturing, e.g., electroplating, electroless plating, or the like techniques. In one embodiment, the choice of a material for the conductive layer determines the choice of a material for the seed layer. For example, if the material for conductive layer includes copper, the material for the seed layer also includes copper. In alternative embodiments, examples of the conductive materials that may be used for the conductive layer to form features 811, 812, 813, 815 and 816 include, but are not limited to e.g., copper (Cu), ruthenium (Ru), nickel (Ni), cobalt (Co), chromium (Cr), iron (Fe), manganese (Mn), titanium (Ti), aluminum (Al), hafnium (Hf), tantalum (Ta), tungsten (W), vanadium (V), molybdenum (Mo), palladium (Pd), gold (Au), silver (Au), platinum Pt, zirconium, tin, lead, metal alloys, metal carbides, e.g., hafnium carbide, zirconium carbide, titanium carbide, tantalum carbide, aluminum carbide, other conductive materials, or any combination thereof.

In one embodiment, forming the conductive features 811, 812, 813, 815 and 816 involves removing the portions of the conductive layer and the base layer outside the openings in the insulating layer 611 using etching, polishing, or a combination of thereof techniques, e.g., a chemical-mechanical polishing (CMP) technique known to one of ordinary skill in the art of microelectronic device manufacturing.

Figures 9A, 9B, 9C:
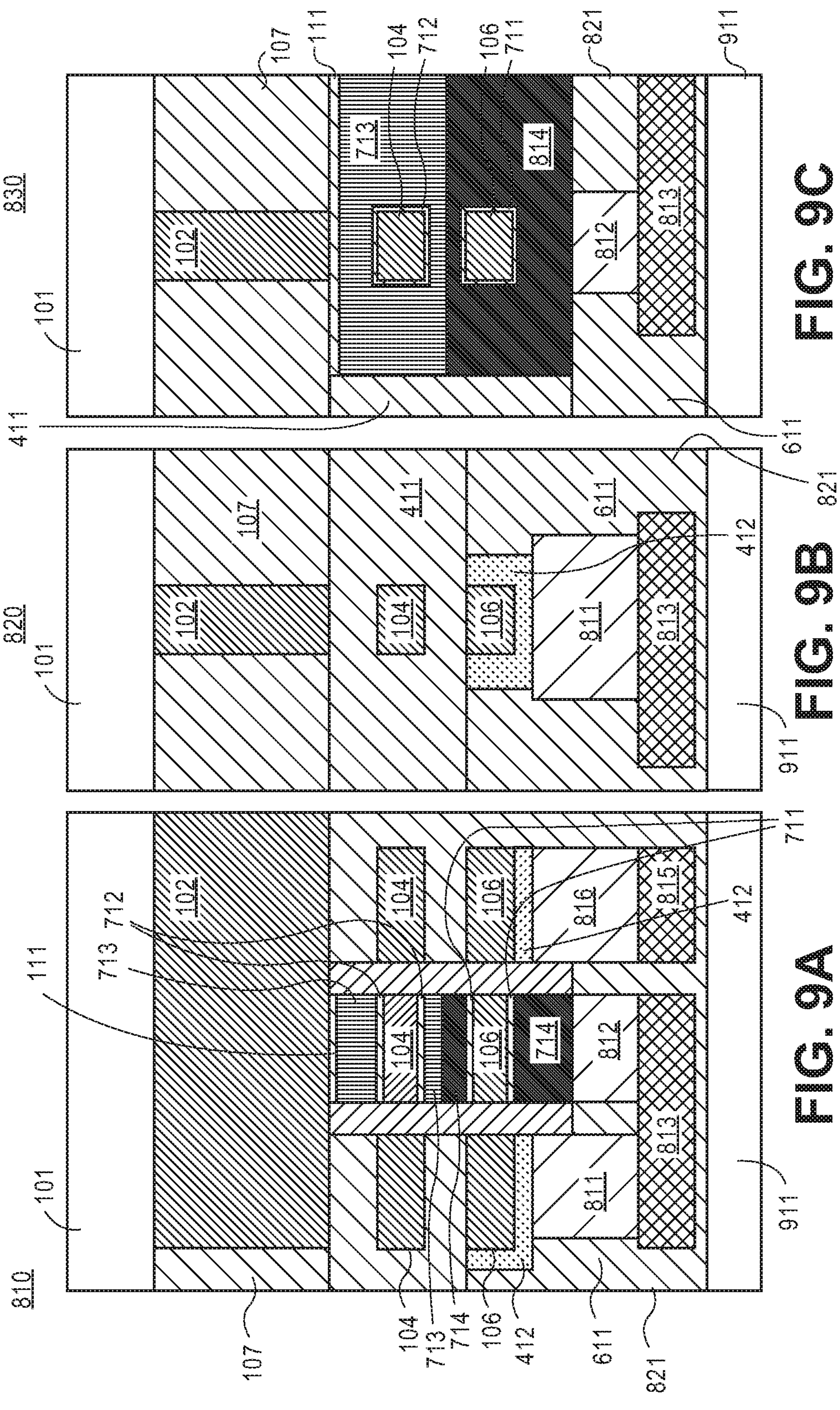
FIG. 9A is a view similar to FIG. 8A after an interconnect layer is deposited on the device layer according to one embodiment.
FIG. 9B is a view similar to FIG. 8B after an interconnect layer is deposited on the device layer according to one embodiment.
FIG. 9C is a view similar to FIG. 8C after an interconnect layer is deposited on the device layer according to one embodiment.

FIG. 9A is a view 910 similar to FIG. 8A, FIG. 9B is a view 920 similar to FIG. 8B, and FIG. 9C is a view 930 similar to FIG. 8C after the portion of the electronic device is flipped and bonded to a carrier substrate 911 according to one embodiment. Interconnect layer 821 is attached to carrier substrate 911 to form contact regions on the device layer 104. In various implementations, the substrate 911 can be, e.g., a glass, an organic, a ceramic, or a semiconductor substrate. In one embodiment substrate 911 is one of the substrates described above with respect to substrate 101. In one embodiment, the interconnect layer 821 is attached to carrier substrate using one of substrate bonding techniques, e.g., oxide to oxide bonding, polymer to polymer bonding, metal to metal bonding, nitride to nitride bonding known to one of ordinary skill in the art of microelectronic device manufacturing.

In one embodiment, an adhesion layer (not shown) is deposited on the carrier substrate 911 to bond the carrier substrate to interconnect layer 821. In one embodiment, the adhesive layer comprises organic materials, inorganic materials, or both. In one embodiment, the adhesion layer is an amorphous hydrogenated silicon layer, a carbon doped silicon oxide layer, thermoplastic polymer layer, or any other adhesive material known to one of ordinary skill in the art of microelectronic device manufacturing. In an embodiment, the adhesive layer is blanket deposited on carrier substrate 911 using one of adhesion layer deposition techniques known to one of ordinary skill in the art of microelectronic device manufacturing.

Figures 10A, 10B, 10C:
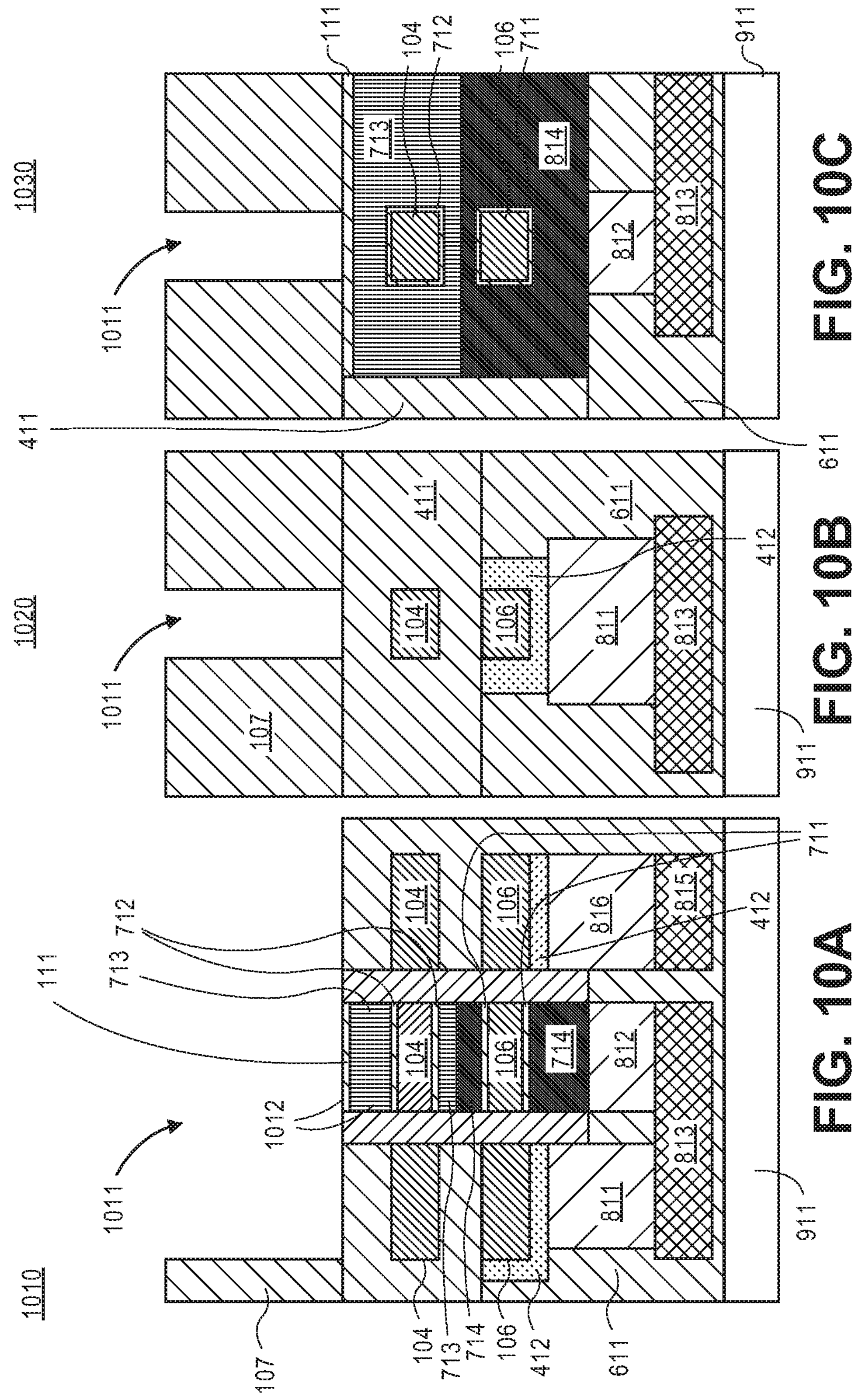
FIG. 10A is a view similar to FIG. 9A after the portions of the fin and substrate are removed according to one embodiment.
FIG. 10B is a view similar to FIG. 9B after the portions of the fin and substrate are removed according to one embodiment.
FIG. 10C is a view similar to FIG. 9C after the portions of the fin and substrate are removed according to one embodiment.

FIG. 10A is a view 1010 similar to FIG. 9A, FIG. 10B is a view 1020 similar to FIG. 9B, and FIG. 10C is a view 1030 similar to FIG. 9C after a gate portion 1012 of device layer 104 is revealed according to one embodiment. In one embodiment, revealing gate portion 1012 involves removing the portions of the fin 102 and substrate 101. In one embodiment, backside substrate 101 is removed using one or more of the substrate removal techniques such as but not limited to CMP, etching, or both. In one embodiment, the portions of the fin 102 are removed using one or more of the substrate removal techniques such as but not limited to grinding, CMP, etching, or any combination thereof. The substrate 101 and portions of the fin 102 are removed to form a backside opening 1011 that exposes a gate portion 1012 of the device layer 104.

Figures 11A, 11B, 11C:
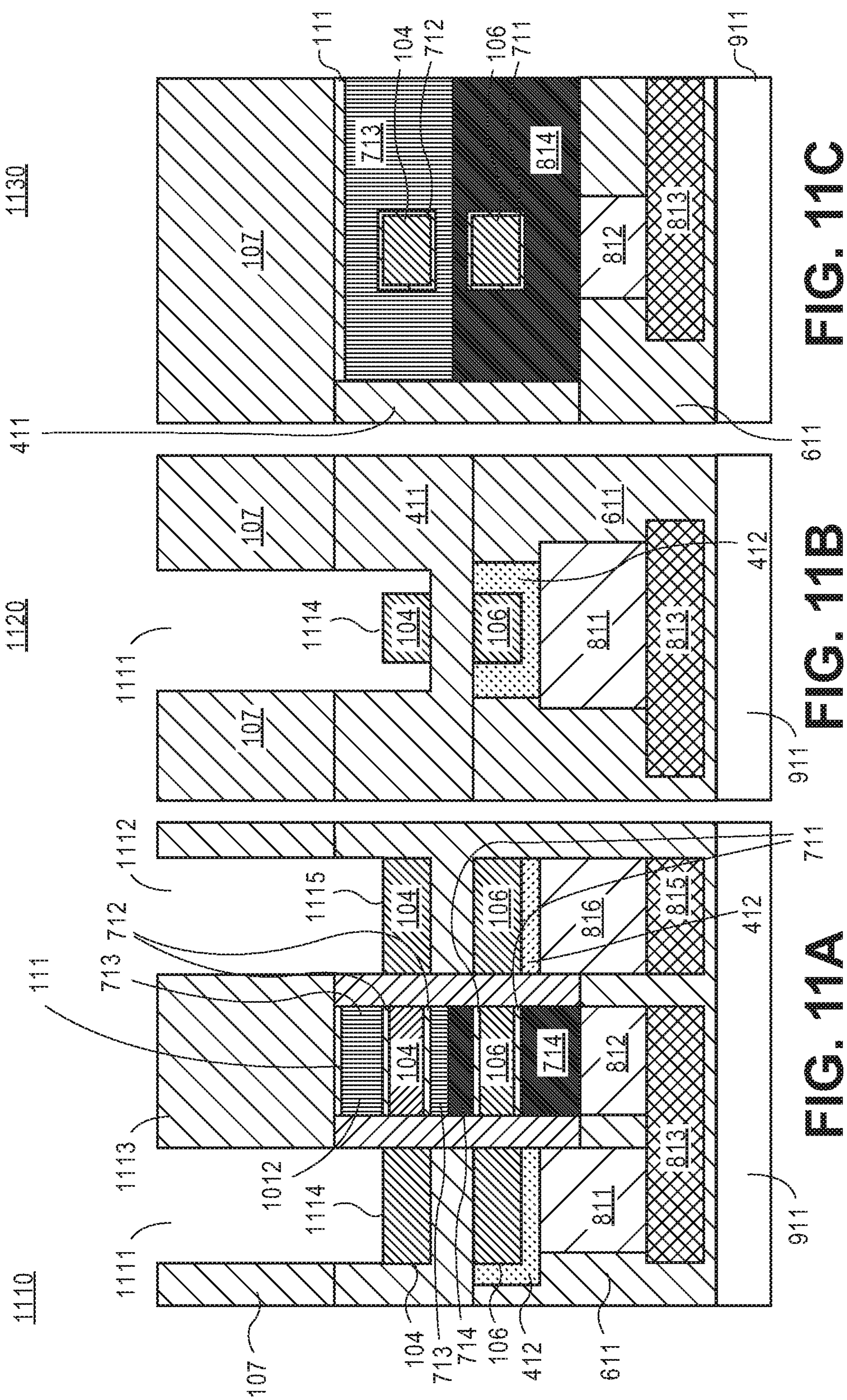
FIG. 11A is a view similar to FIG. 10A after an insulating layer filling the backside opening is deposited onto the gate portion according to one embodiment.
FIG. 11B is a view similar to FIG. 10B after an insulating layer filling the backside opening is deposited onto the gate portion according to one embodiment.
FIG. 11C is a view similar to FIG. 10C after an insulating layer filling the backside opening is deposited onto the gate portion according to one embodiment.

FIG. 11A is a view 1110 similar to FIG. 10A, FIG. 11B is a view 1120 similar to FIG. 10B, and FIG. 11C is a view 1130 similar to FIG. 10C after an insulating layer 1113 is deposited onto gate portion 1012 filling the backside opening 1011 according to one embodiment. Backside openings 1111 and 1112 are formed in the insulating layer 1113 to expose portions 1114 and 1115 of the device layer 104 to form contact regions. In one embodiment, insulating layer 1113 is one of the insulating layers described above. In one embodiment, insulating layer 1113 is deposited using one of the insulating layer deposition techniques described above. In one embodiment, openings 1112 and 1112 are formed using one or more of the patterning and etching techniques known to one of ordinary skill in the art of microelectronic device manufacturing.

Figures 12A, 12B, 12C:
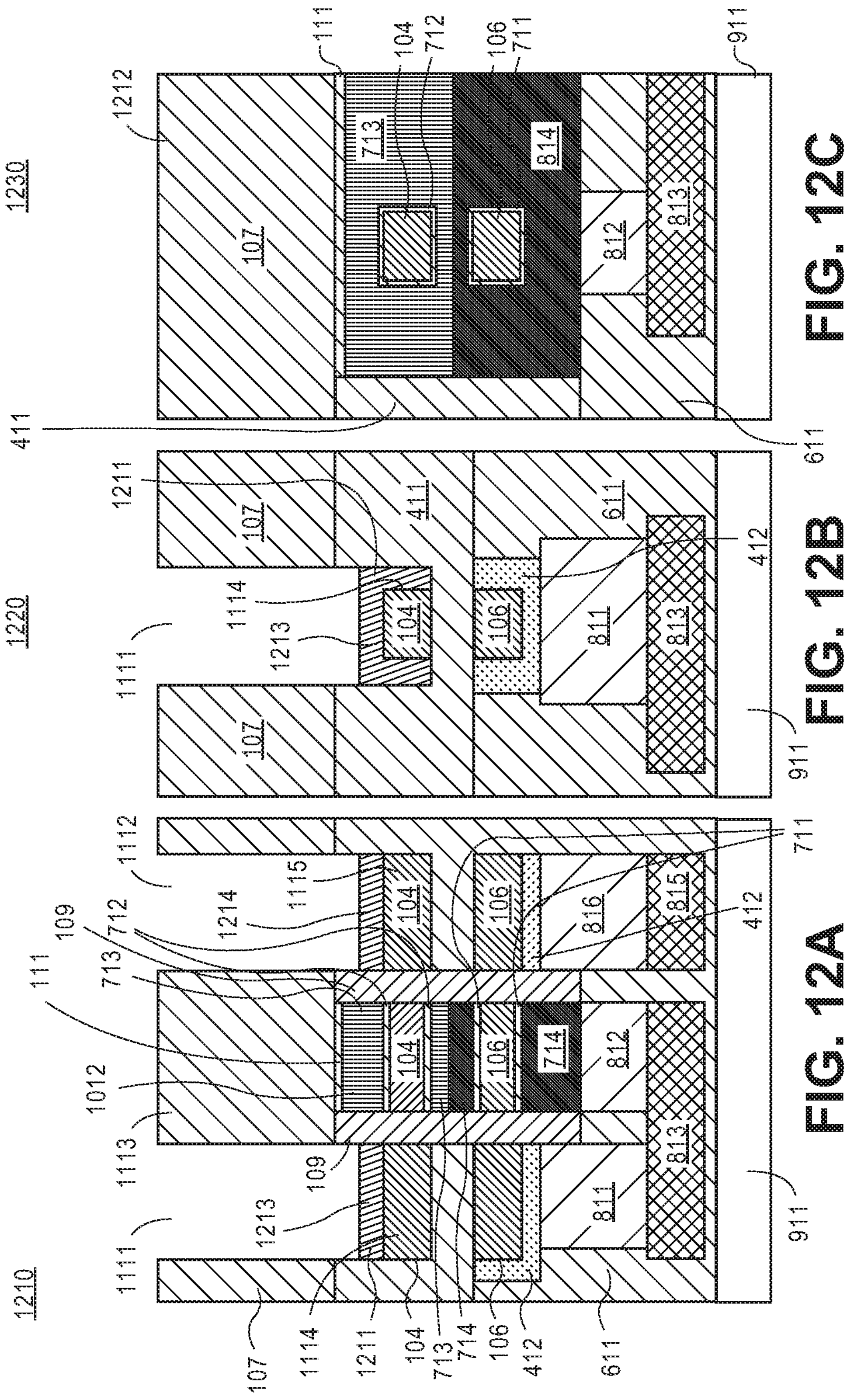
FIG. 12A is a view similar to FIG. 11A after a doped layer is deposited through the backside opening according to one embodiment.
FIG. 12B is a view similar to FIG. 11B after a doped layer is deposited through the backside opening according to one embodiment.
FIG. 12C is a view similar to FIG. 11C after a doped layer is deposited through the backside opening according to one embodiment.

FIG. 12A is a view 1210 similar to FIG. 11A, FIG. 12B is a view 1220 similar to FIG. 11B, and FIG. 12C is a view 1230 similar to FIG. 11C after a doped layer 1211 is deposited through backside opening 1111 to portion 1114 and through backside opening 1112 to portion 1115 according to one embodiment. In one embodiment, the portions 1114 and 1115 are contact regions of the device layer 104. In one embodiment, the portions 1114 and 1115 are source/drain regions, or other contact regions of the device layer 104. That is, the source/drain portions 1114 and 1115 of the device layer 104 are formed using the backside epitaxial layer processing. As shown in FIGS. 12A, 12B, and 12C, an insulating layer 1212 comprises insulating layer 107, insulating layer 411 insulating layer 611 and insulating layer 1113.

In one embodiment, doped layer 1211 is epitaxially grown on the portions 1114 and 1115. In one embodiment, the concentration of the dopants in the doped layer 1211 is greater than in the portions 1114 and 1115. In one embodiment, the doped layer 1211 is a n-type semiconductor layer. In another embodiment, the doped layer 1211 is a p-type semiconductor layer. In one embodiment, the doped layer 412 is an n-type semiconductor layer, and the doped layer 1211 is a p-type semiconductor layer, or vise versa. In another embodiment, both the doped layers 412 and 1211 are n-type semiconductor layers, or p-type semiconductor layers. In one embodiment, doped layer 1211 is a silicon layer. In one embodiment, doped layer 1211 is a p-type silicon layer comprising p-type dopants, e.g., boron, aluminum, nitrogen, gallium, indium, other p-type dopants, or any combination thereof. In one embodiment, doped layer 1211 is a n-type silicon layer comprising n-type dopants, e.g., phosphorous, arsenic, bismuth, lithium, other n-type dopants, or any combination thereof. In alternative embodiments, the doped layer 1211 is a silicon, germanium, silicon germanium, III-V materials based layer, or any combination thereof. In one embodiment, the thickness of the doped layer 1211 is from about 10 nm to about 50 nm.

In alternative embodiments, the doped layer 1211 is selectively deposited through the back side openings 1111 and 1112 on the exposed portions 1114 and 1115 of the device layer 104 using one or more deposition techniques, such as but not limited to a chemical vapour deposition ("CVD"), e.g., a plasma enhanced chemical vapour deposition ("PECVD"), a physical vapour deposition ("PVD"), molecular beam epitaxy ("MBE"), metalorganic chemical vapor deposition ("MOCVD"), atomic layer deposition ("ALD"), or other deposition techniques known to one of ordinary skill in the art of microelectronic device manufacturing.

In one embodiment, the doped layer 1211 is annealed at an elevated temperature greater than a room temperature for a predetermined time to drive the dopants into the portions 1114 and 1115 to form the source/drains 1213 and 1214. In one embodiment, the doped layer 1211 is annealed at the temperature from about 800 degrees C. to about 1200 degrees C. for about 0.25 seconds or less.

In one embodiment, after the annealing the doped layer 1211 is removed using one or more of the doped layer removal techniques such as but not limited to chemical mechanical polishing (CMP), etching, or both. In one embodiment, the annealed doped layer 1211 is removed through the revealed backside.

Figures 13A, 13B, 13C:
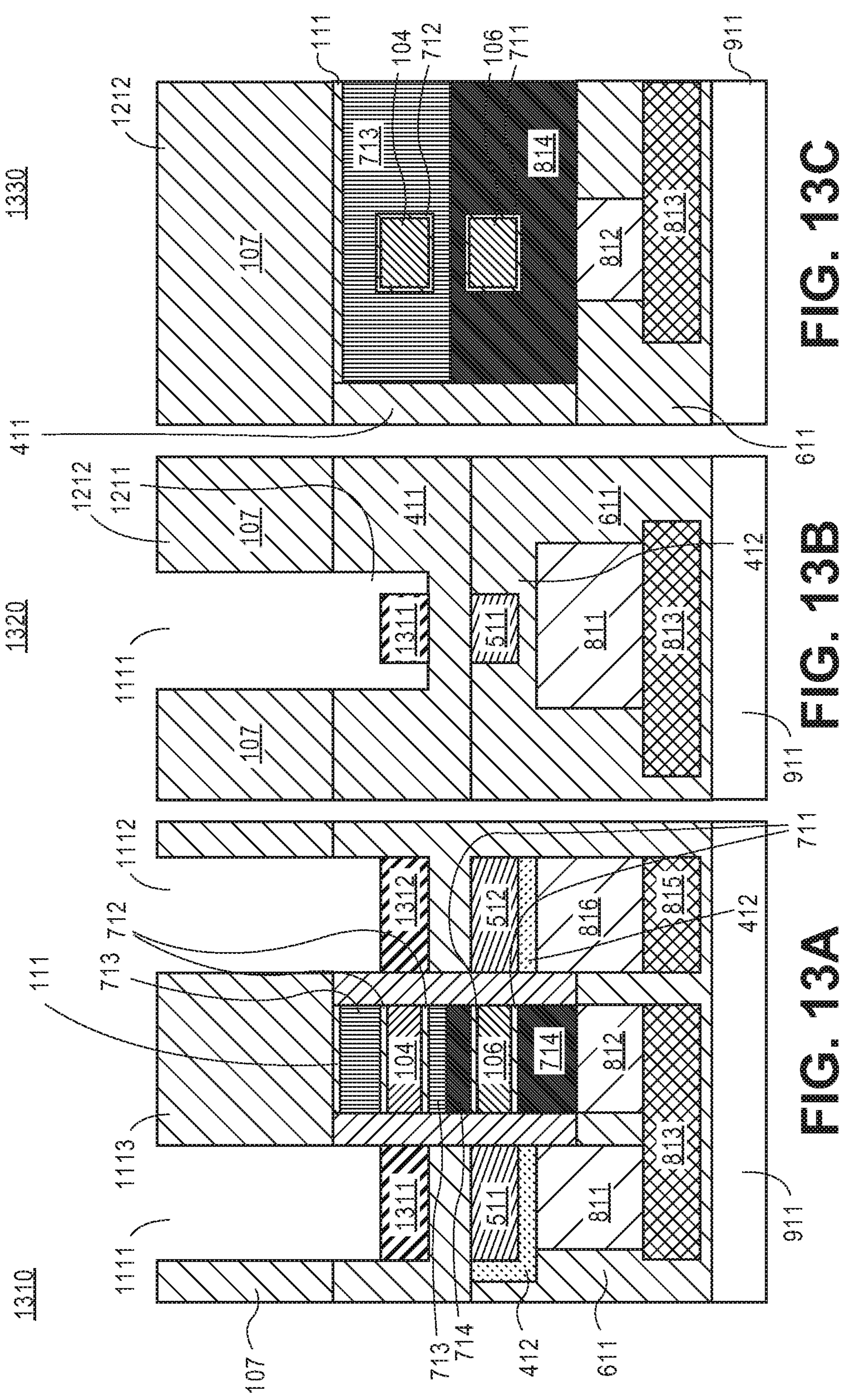
FIG. 13A is a view similar to FIG. 11A after adding dopants through the backside openings to form source/drain regions according to another embodiment.
FIG. 13B is a view similar to FIG. 11B after adding dopants through the backside openings to form source/drain regions according to another embodiment.
FIG. 13C is a view similar to FIG. 11C after adding dopants through the backside openings to form source/drain regions according to another embodiment.

FIG. 13A is a view 1310 similar to FIG. 11A, FIG. 13B is a view 1320 similar to FIG. 11B, and FIG. 13C is a view 1330 similar to FIG. 11C after adding dopants through backside openings 1111 and 1112 to the exposed portions 1114 and 1115 of the device layer 104 to form a source/drain region 1311 and a source/drain region 1312 according to another embodiment. That is, the source/drain regions 1311 and 1312 are formed through the backside reveal processing.

In one embodiment, the dopants are added to the exposed portions 1114 and 1115 using one of implantation techniques known to one of ordinary skill in the art of microelectronic device manufacturing. In one embodiment, the dopants added to the exposed portions 1114 and 1115 are n-type dopants, e.g., phosphorous, arsenic, bismuth, lithium, other n-type dopants, or any combination thereof. In another embodiment, the dopants added to the exposed portions 1114 and 1115 are p-type dopants, e.g., boron, aluminum, nitrogen, gallium, indium, other p-type dopants, or any combination thereof.

Figures 14A, 14B, 14C:
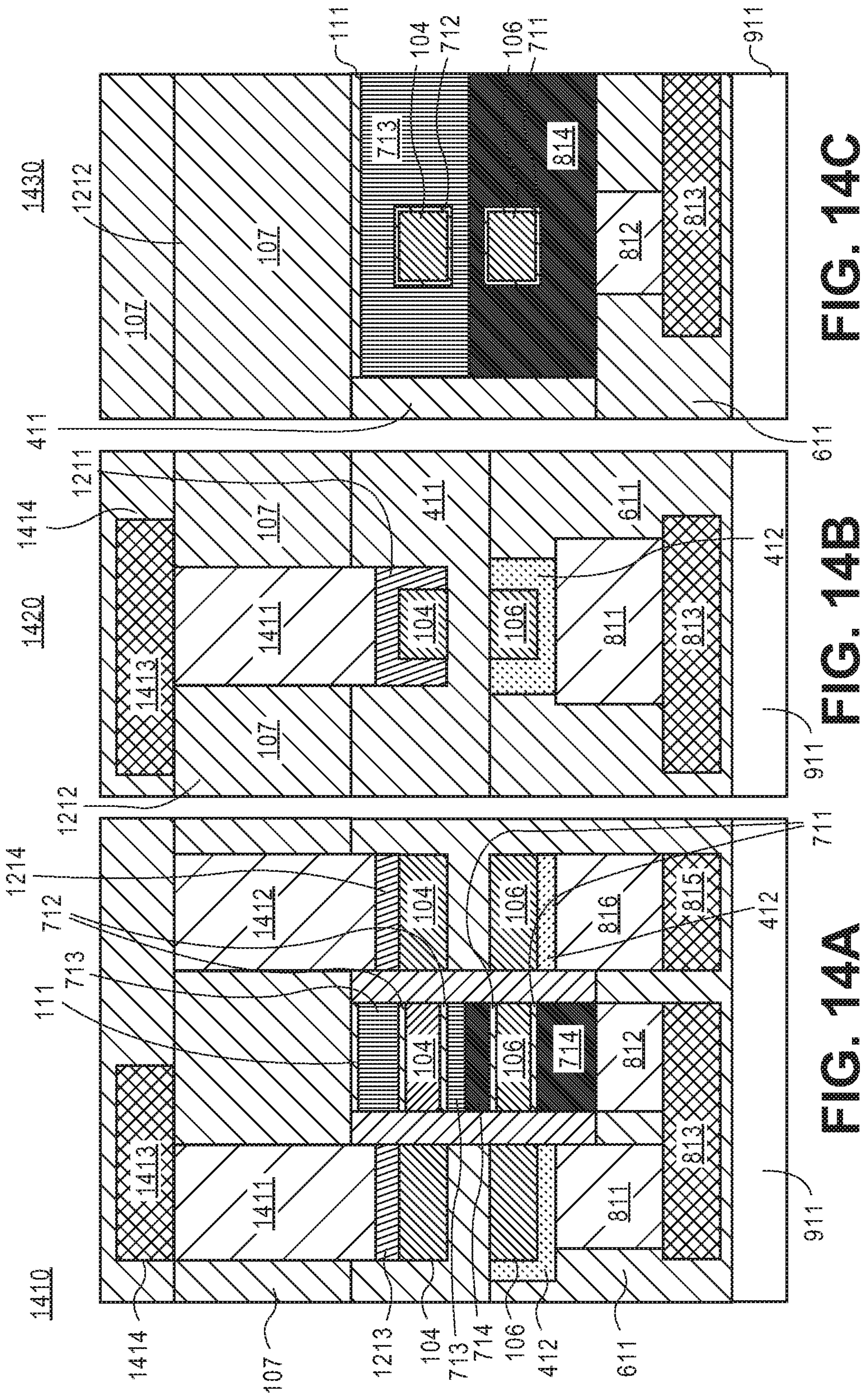
FIG. 14A is a view similar to FIG. 12A after an interconnect layer is deposited on the device layer according to one embodiment.
FIG. 14B is a view similar to FIG. 12B after an interconnect layer is deposited on the device layer according to one embodiment.
FIG. 14C is a view similar to FIG. 12C after an interconnect layer is deposited on the device layer according to one embodiment.

FIG. 14A is a view 1410 similar to FIG. 12A, FIG. 14B is a view 1420 similar to FIG. 12B, and FIG. 14C is a view 1430 similar to FIG. 12C after an interconnect layer 1414 is deposited on device layer 104 according to one embodiment. Interconnect layer 1414 comprises conductive features 1411, 1412 and 1413. A conductive feature 1411 connects to source/drain 1213 and a conductive feature 1412 connects to source/drain 1214 of the device layer 104. In another embodiment, conductive feature 1411 connects to source/drain 1311 and conductive feature 1412 connects to source/drain 1312 shown in FIGS. 13A and 13B.

In one embodiment, the conductive features 1411 and 1412 are conductive vias, trenches, or other conductive features to connect the device layer to the features of the interconnect layer 1414. Conductive feature 1413 connects to conductive feature 1411. In one embodiment, conductive feature 1413 is a conductive line. In another embodiment, conductive feature 1413 is a via, trench, or other conductive feature. In one embodiment, each of the conductive features of the interconnect layer 1414 is one of the conductive features described above. In one embodiment, each of the conductive features of the interconnect layer 1414 is formed using one of the conductive features forming techniques described above.

Figure 15:
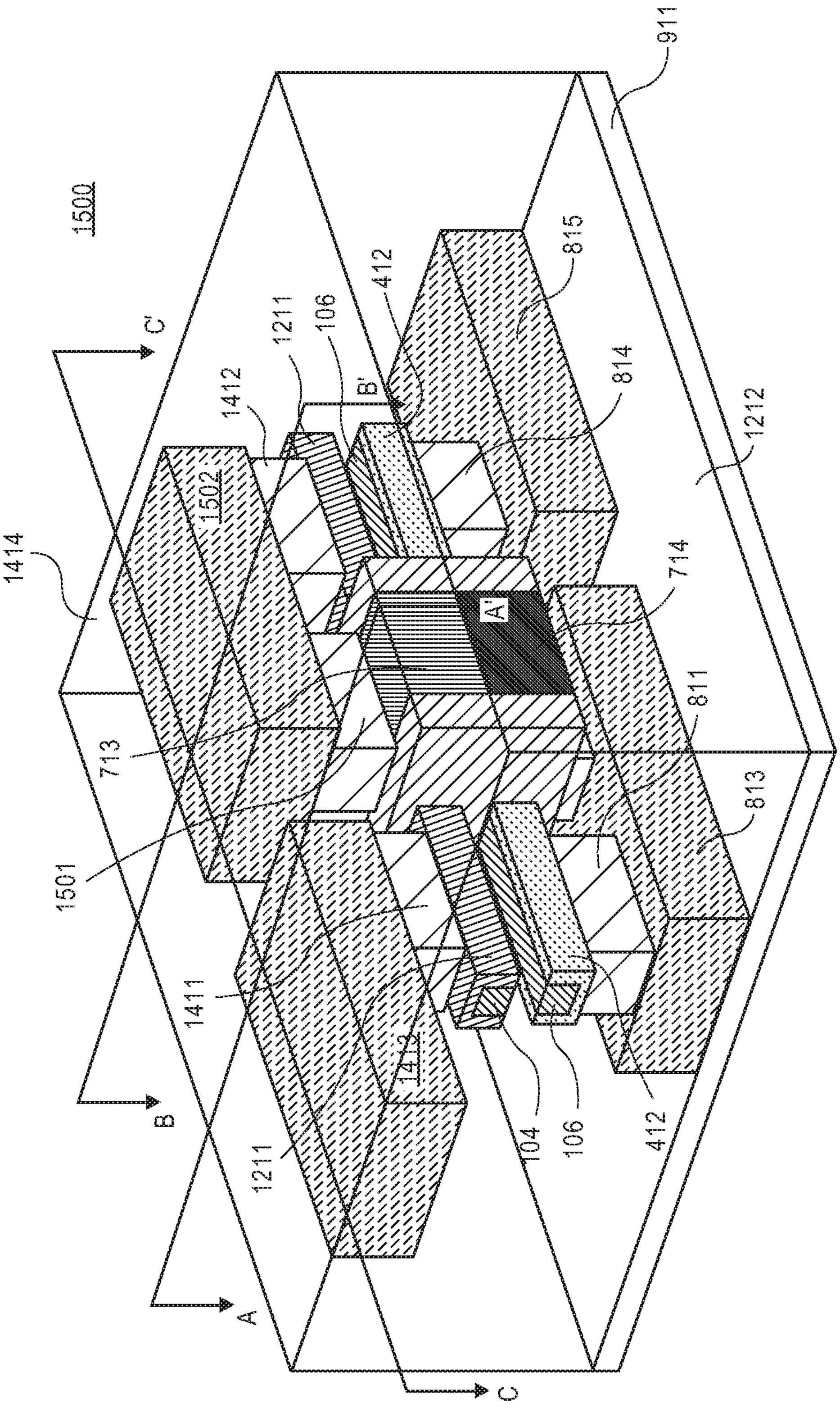
FIG. 15 is a three-dimensional view of a portion of an electronic device according to one embodiment.

FIG. 15 is a three-dimensional view of a portion of an electronic device 1500 according to one embodiment. The embodiment of the device 1500 shown in FIG. 15 is different from the FIGS. 14A, 14B, and 14C in that the interconnect layer 1414 comprises a conductive feature 1501 deposited on metal gate 713 and a conductive feature 1502 deposited on conductive features 1501 and 1412. In one embodiment, the conductive feature 1501 is a conductive via, trench, or other conductive features to connect the gate 713 to the features of the interconnect layer 1414. In one embodiment, conductive feature 1502 is a conductive line. In another embodiment, conductive feature 1502 is a via, trench, or other conductive feature. In one embodiment, each of the conductive features of the interconnect layer 1414 is one of the conductive features described above. In one embodiment, each of the conductive features of the interconnect layer 1414 is formed using one of the conductive features forming techniques described above.

Figures 16A, 16B, 16C:
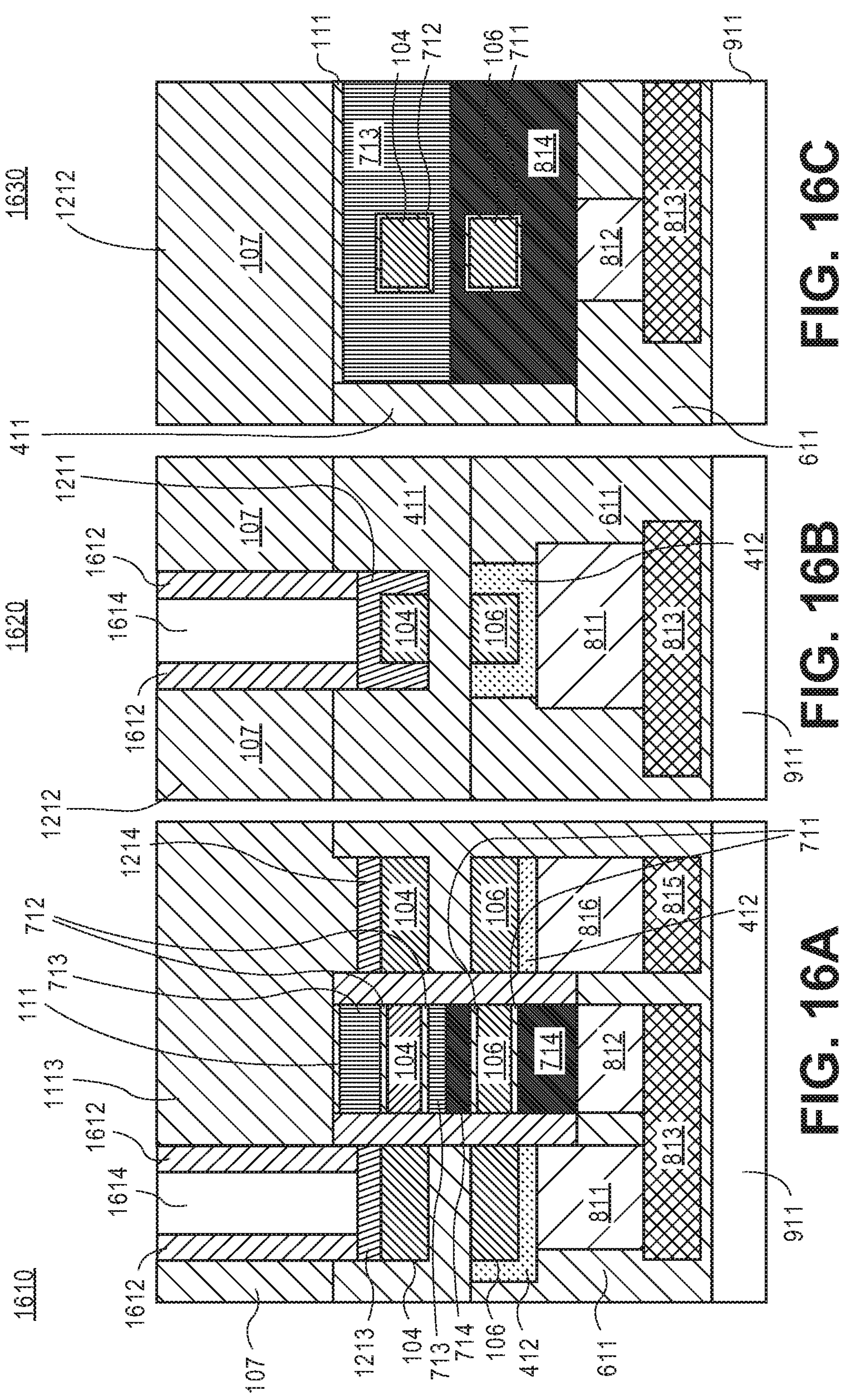
FIG. 16A is a view similar to FIG. 12A after a spacer layer is deposited on a sidewall of the opening according to one embodiment.
FIG. 16B is a view similar to FIG. 12B after a spacer layer is deposited on a sidewall of the opening according to one embodiment.
FIG. 16C is a view similar to FIG. 12C after a spacer layer is deposited on a sidewall of the opening according to one embodiment.

FIG. 16A is a view 1610 similar to FIG. 12A, FIG. 16B is a view 1620 similar to FIG. 12B, and FIG. 16C is a view 1630 similar to FIG. 12C after a spacer layer 1612 is deposited on a sidewall of the opening 1111 according to one embodiment. FIG. 16A is different FIG. 12A in that the insulating layer 1113 is deposited on the source/drain 1214. As shown in FIGS. 16A and 16B, spacer layer 1612 is deposited to narrow the opening 1111, so that an opening 1614 is formed. The opening 1614 is formed down to source/drain 1213. The width of the opening 1614 is smaller than the width of the opening 1111. In one embodiment, spacer layer 1612 is one of the spacer layers described above. In one embodiment, spacer layer 1612 is deposited using one of the spacer deposition techniques described above.

In another embodiment, insulating layer 1113 is deposited on source/drain 1213, gate portion 1012 and source/drain 1214, and opening 1614 is formed by patterning and etching insulating layer 1113. In one embodiment, opening 1614 is formed to connect source/drain regions of the device layer 106 with the source/drain region of the device layer 104.

Figures 17A, 17B, 17C:
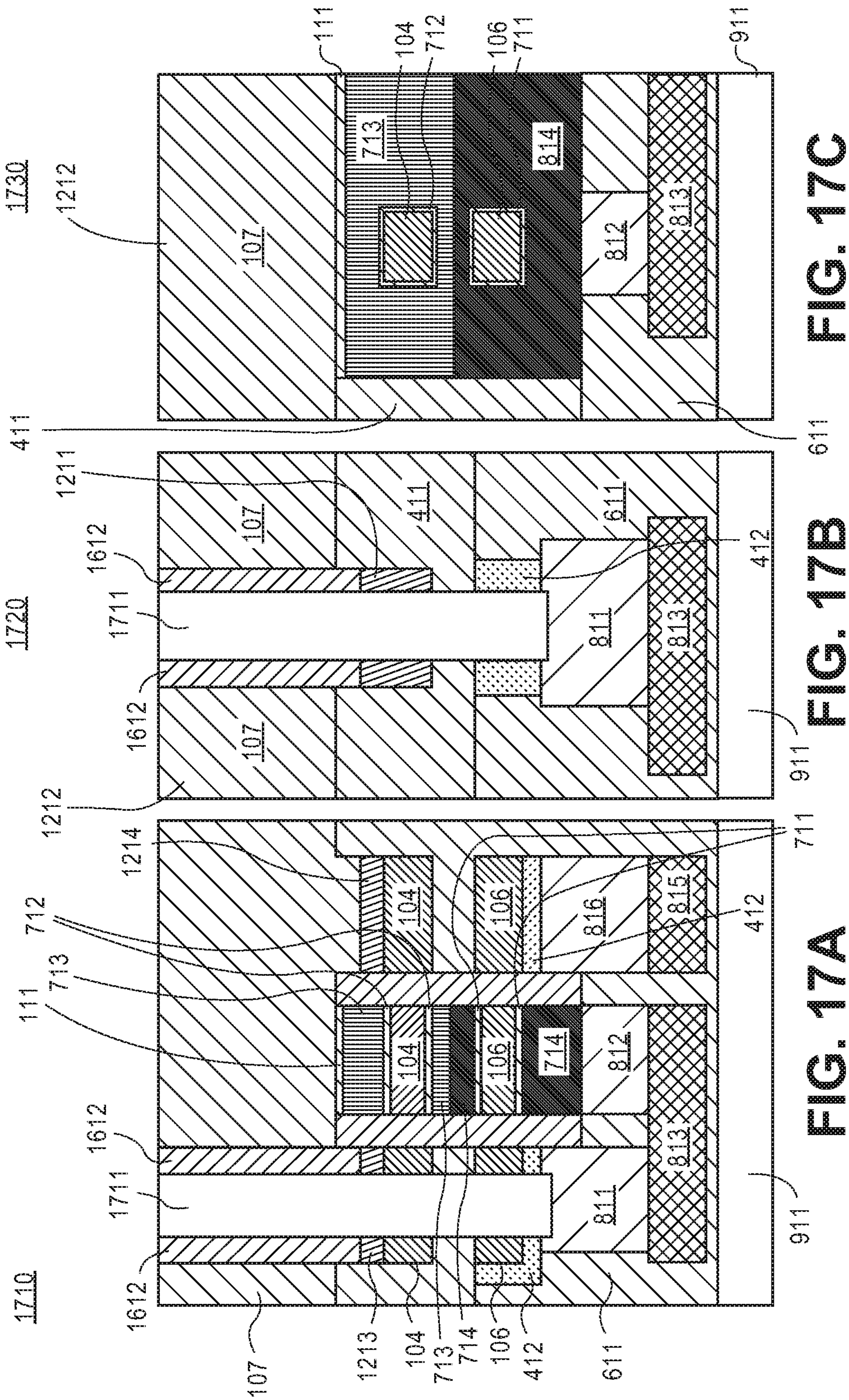
FIG. 17A is a view similar to FIG. 16A after an opening is formed through the device layers according to one embodiment.
FIG. 17B is a view similar to FIG. 16B after an opening is formed through the device layers according to one embodiment.
FIG. 17C is a view similar to FIG. 16C after an opening is formed through the device layers according to one embodiment.

FIG. 17A is a view 1710 similar to FIG. 16A, FIG. 17B is a view 1720 similar to FIG. 16B, and FIG. 17C is a view 1730 similar to FIG. 16C after an opening 1711 is formed through the device layers 104 and 106 down to conductive feature 811 according to one embodiment. In one embodiment, opening 1711 is formed by etching portions of insulating layer 411 and portions of device layers 104 and 106 using one or more etching techniques known to one of ordinary skill in the art of microelectronic device manufacturing.

Figures 18A, 18B, 18C:
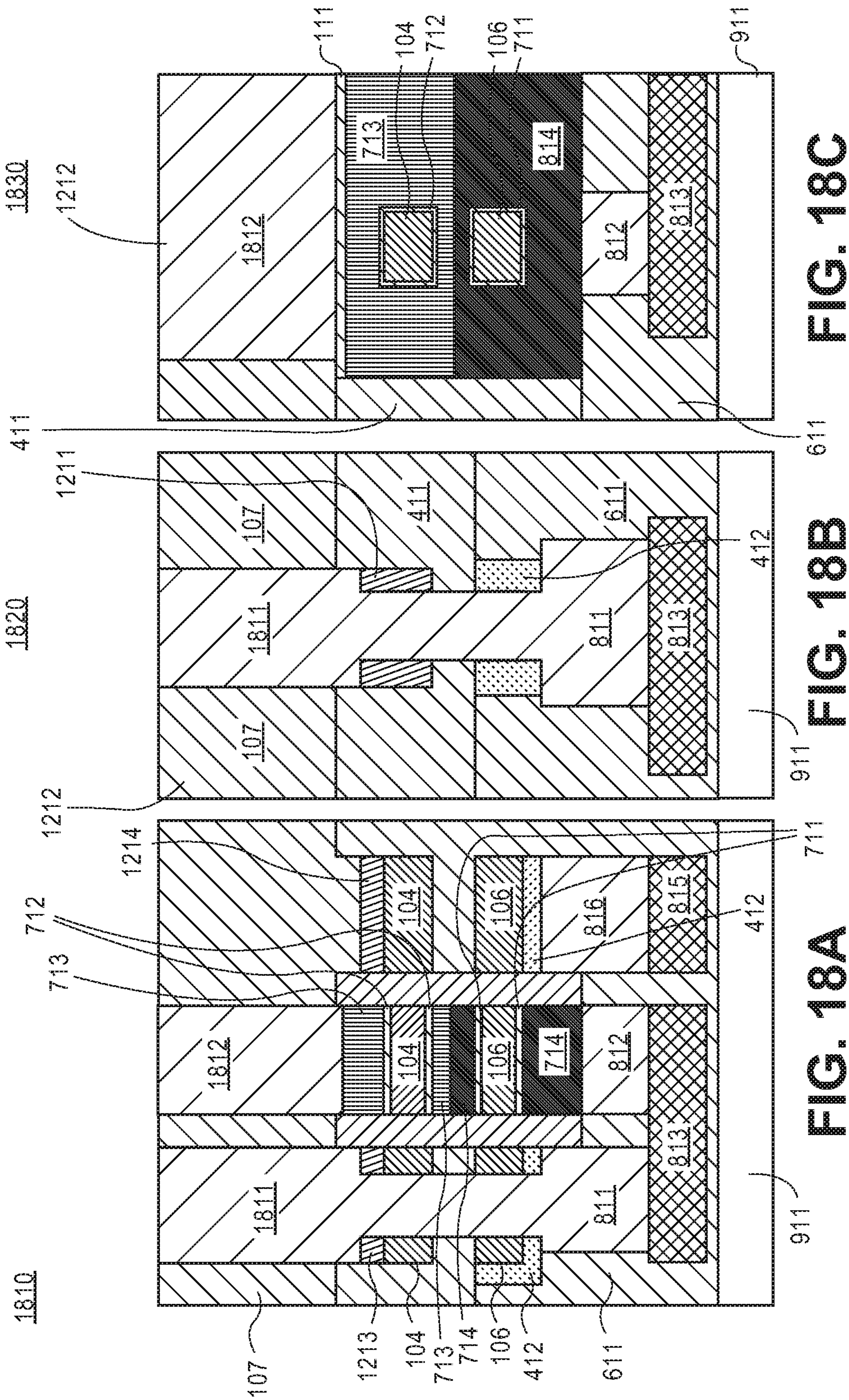
FIG. 18A is a view similar to FIG. 17A after the spacer layer is removed, and a conductive feature is deposited into the opening in the insulating layer according to one embodiment.
FIG. 18B is a view similar to FIG. 17B after the spacer layer is removed, and a conductive feature is deposited into the opening in the insulating layer according to one embodiment.
FIG. 18C is a view similar to FIG. 17C after the spacer layer is removed, and a conductive feature is deposited into the opening in the insulating layer according to one embodiment.

FIG. 18A is a view 1810 similar to FIG. 17A, FIG. 18B is a view 1820 similar to FIG. 17B, and FIG. 18C is a view 1830 similar to FIG. 17C after the spacer layer 1612 is removed, and a conductive feature 1811 is deposited into the opening in the insulating layer according to one embodiment. As shown in FIGS. 18A, 18B, and 18C, a conductive feature 1812 is deposited on metal gate 713. In one embodiment, an opening is formed in insulating layer 1212 to expose metal gate 713 using one of the etching techniques described above. In one embodiment, the conductive layer 1812 is deposited on the exposed metal gate 713 through the opening in the insulating layer 1212.

In one embodiment, the spacer layer 1612 is removed using one of the spacer layer removal techniques known to one of ordinary skill in the art of microelectronic device manufacturing. In one embodiment, each of the conductive features 1811 and 1812 is represented by one of the conductive features described above. In one embodiment, each of the conductive features 1811 and 1812 is deposited using one of the conductive features deposition techniques described above.

Figures 19A, 19B, 19C:
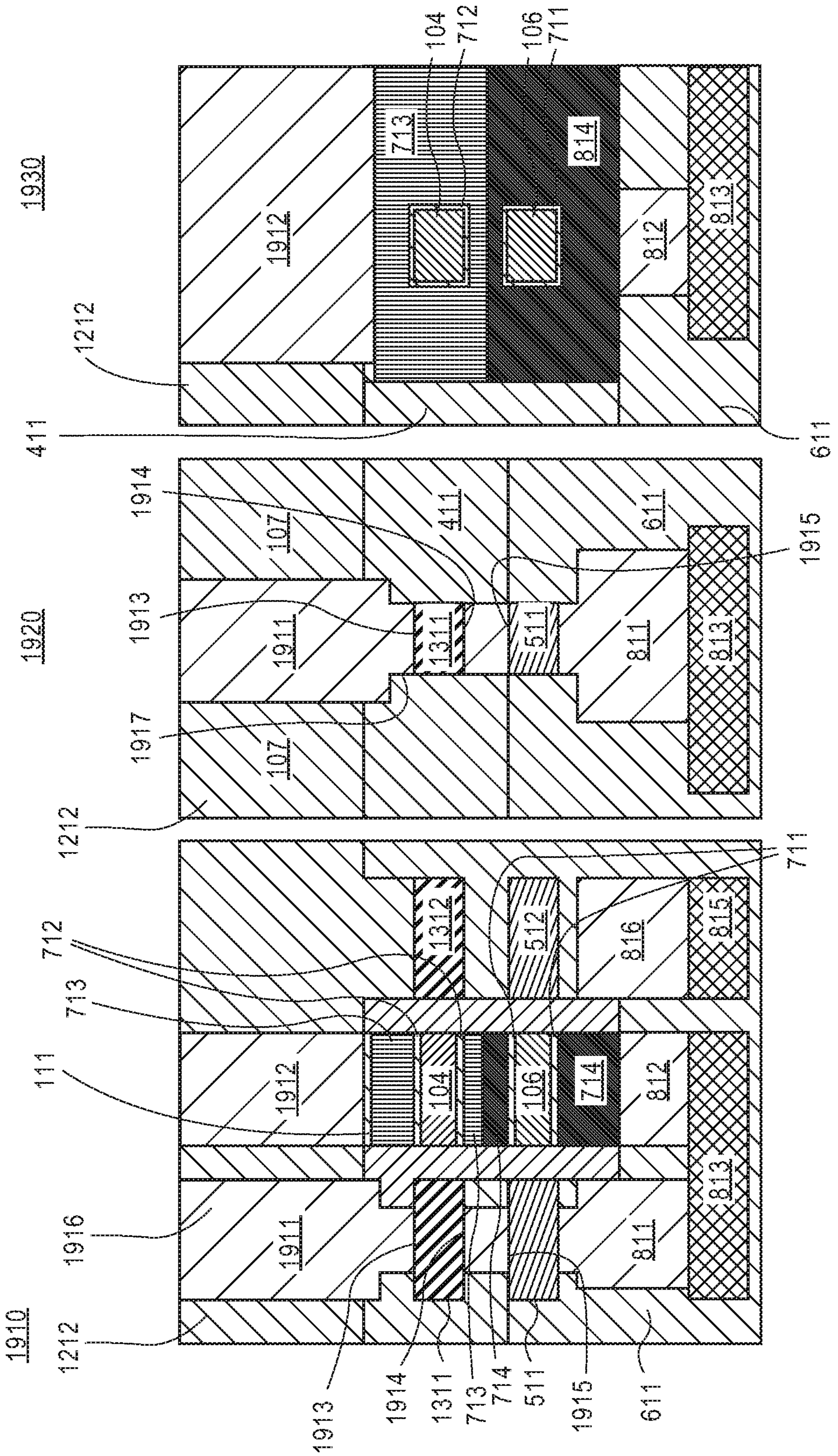
FIG. 19A is a view similar to FIG. 16A after conductive features are deposited according to another embodiment.
FIG. 19B is a view similar to FIG. 16B after conductive features are deposited according to another embodiment.
FIG. 19C is a view similar to FIG. 16C after conductive features are deposited according to another embodiment.

FIG. 19A is a view 1910 similar to FIG. 16A, FIG. 19B is a view 1920 similar to FIG. 16B, and FIG. 19C is a view 1930 similar to FIG. 16C after a conductive feature 1912 and a conductive feature 1912 are deposited according to another embodiment. In one embodiment, the source/drain regions 1311 and 1312 are the source/drain regions formed using the implantation technique, as described with respect to FIGS. 13A, 13B, and 13C. In one embodiment, the source/drain regions 1311 and 1312 represent source/drain regions 1213 and 1214 respectively. In one embodiment, an opening in the insulating layer 1212 is formed to expose source/drain region 1311 and source/drain region 511. In one embodiment, the opening is formed by etching the insulating layer 1212 selectively to the device layers 106 and 104 to expose source/drain region 1311 and source/drain region 511. In one embodiment, a spacer layer is deposited to narrow the opening in the insulating layer, as described above with respect to FIGS. 16A, 16B, and 16C. In one embodiment, a portion 1917 of the conductive feature 1911 is deposited through the narrowed opening in the insulating layer 1212 onto exposed sidewalls 1913 and 1914 of the source/drain region 1311 and onto the exposed sidewall 1915 of the source/drain region 511. In one embodiment, the spacer layer is removed, and then a portion 1916 of the conductive feature 1911 that fills the opening in the insulating layer 1212 is deposited on the portion 1917. As shown in FIGS. 19A, 19B, and 19C, conductive feature 1912 is deposited on metal gate 713.

In one embodiment, the opening in insulating layer 1212 is formed using one of the etching techniques described above. In one embodiment, the spacer layer is removed using one of the spacer layer removal techniques as described above. In one embodiment, each of the conductive features 1911 and 1912 is one of the conductive layers described above. In one embodiment, each of the conductive features 1911 and 1912 is deposited using one of the conductive feature deposition techniques described above.

Figures 20A, 20B, 20C:
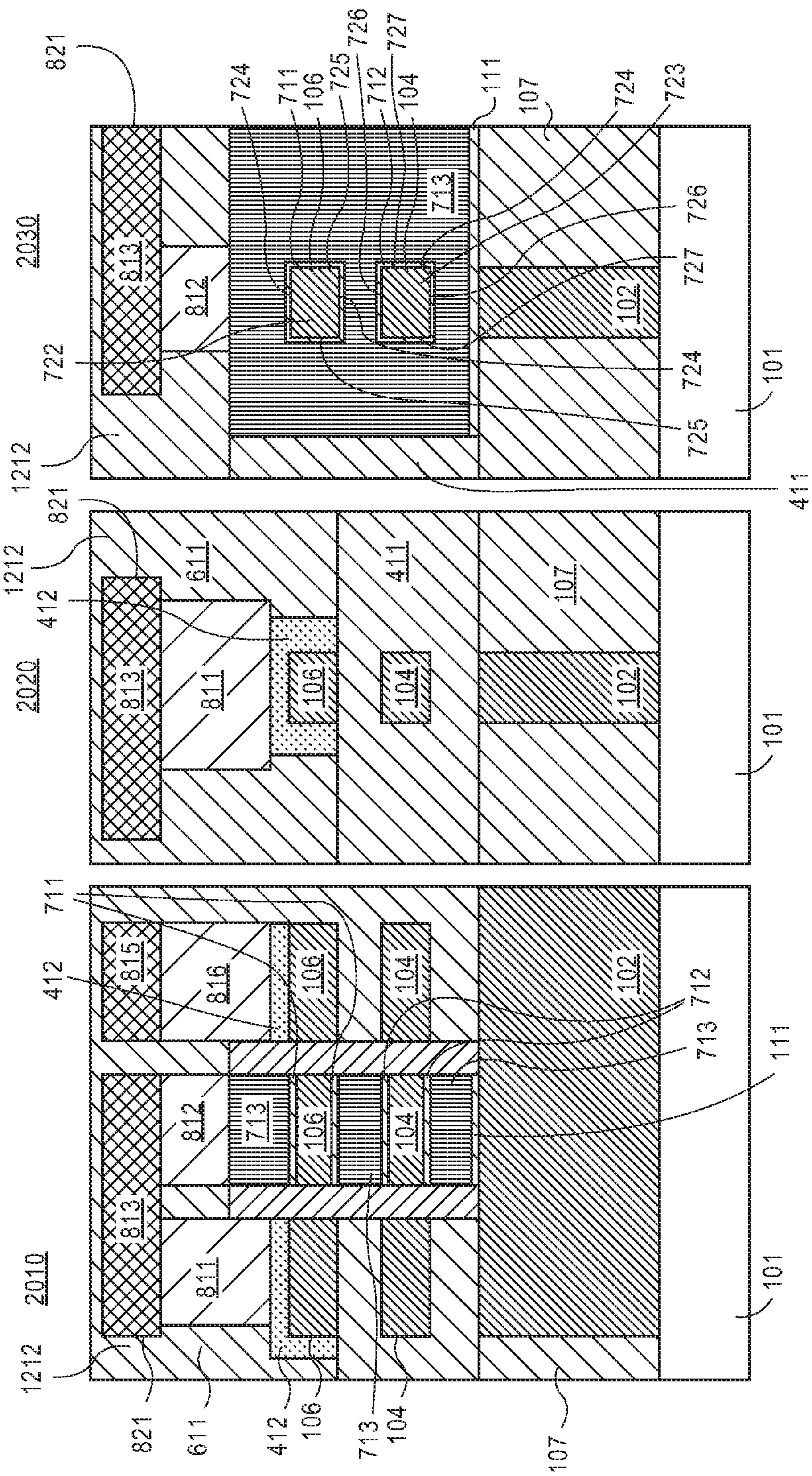
FIG. 20A is a view similar to FIG. 6A after an interconnect layer is deposited on the device layer according to another embodiment.
FIG. 20B is a view similar to FIG. 6B after an interconnect layer is deposited on the device layer according to another embodiment.
FIG. 20C is a view similar to FIG. 6C after an interconnect layer is deposited on the device layer according to another embodiment.

FIG. 20A is a view 2010 similar to FIG. 6A, FIG. 20B is a view 2020 similar to FIG. 6B, and FIG. 20C is a view 2020 similar to FIG. 6C after interconnect layer 821 is deposited on device layer 106 according to another embodiment. FIGS. 20A, 20B, 20C are different from FIGS. 8A, 8B, and 8C in that the metal gate 713 is deposited on oxide layer 711 on all sidewalls 724 and 725 of the portion 722 of the device layer 106 and is deposited on oxide layer 712 on all sidewalls 726 and 727 of the portion 723 of the device layer 104.

Figures 21A, 21B, 21C:
FIG. 21A is a view similar to FIG. 20A after the portion of the electronic device is flipped and bonded to a carrier substrate according to another embodiment.
FIG. 21B is a view similar to FIG. 20B after the portion of the electronic device is flipped and bonded to a carrier substrate.
FIG. 21C is a view similar to FIG. 20C after the portion of the electronic device is flipped and bonded to a carrier substrate.

FIG. 21A is a view 2110 similar to FIG. 20A, FIG. 21B is a view 2120 similar to FIG. 20B, and FIG. 21C is a view 2130 similar to FIG. 20C after the portion of the electronic device is flipped and bonded to carrier substrate 911 and the portions of the fin 102 and substrate 101 are removed according to another embodiment. In one embodiment, the portion of the electronic device is flipped and bonded to carrier substrate, as described above with respect to FIGS. 9A, 9B, and 9C. The substrate 101 and portions of the fin 102 are removed to form a backside opening 2111 that exposes a portion of gate 713. In one embodiment, the portions of the fin 102 and substrate 101 are removed, as described above with respect to FIGS. 10A, 10B, and 10C.

Figures 22A, 22B, 22C:
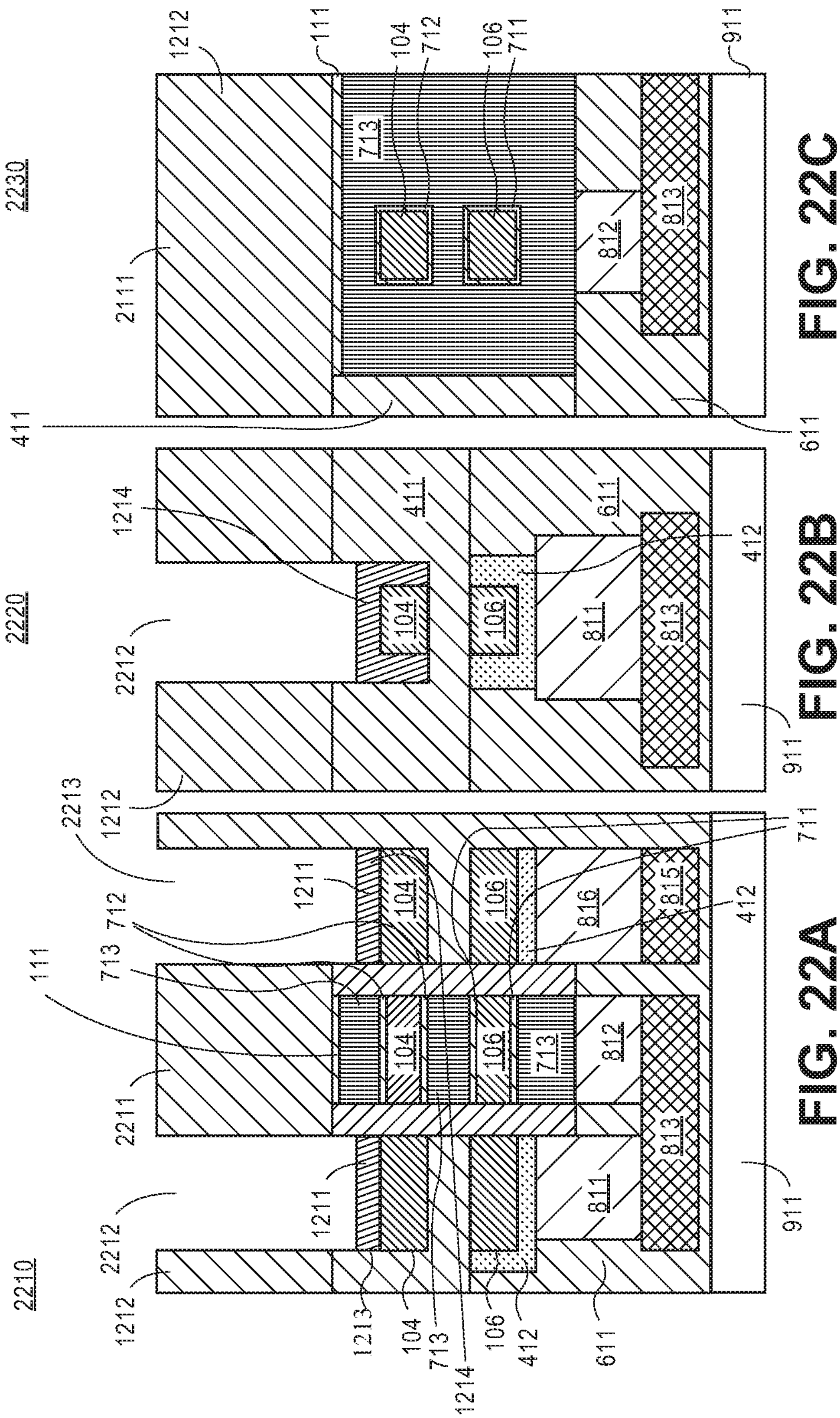
FIG. 22A is a view similar to FIG. 21A after an insulating layer is deposited onto the exposed gate portion according to another embodiment.
FIG. 22B is a view similar to FIG. 21B after an insulating layer is deposited onto the exposed gate portion according to another embodiment.
FIG. 22C is a view similar to FIG. 21C after an insulating layer is deposited onto the exposed gate portion according to another embodiment.

FIG. 22A is a view 2210 similar to FIG. 21A, FIG. 22B is a view 2220 similar to FIG. 21B, and FIG. 22C is a view 2230 similar to FIG. 21C after an insulating layer 2211 is deposited onto the exposed gate portion 713 according to another embodiment. In one embodiment, insulating layer 2211 one of the insulating layers described above. In one embodiment, insulating layer 2211 is a part of the insulating layer 1212. Backside openings 2212 and 2213 are formed in the insulating layer 2211 to expose portions of the device layer 104 to form contact regions, as described above with respect to FIGS. 11A, 11B, and 11C. A doped layer 1211 is deposited through backside openings 2212 and 2213 to the exposed portions of the device layer 104 to form source/drain regions 1213 and 1214, as described above with respect to FIGS. 11A, 11B and 11C. In another embodiment, source/drain regions 1213 and 1214 represent source/drain regions 1311 and 1312 described with respect to FIGS. 13A, 13B, and 13C.

Figures 23A, 23B, 23C:
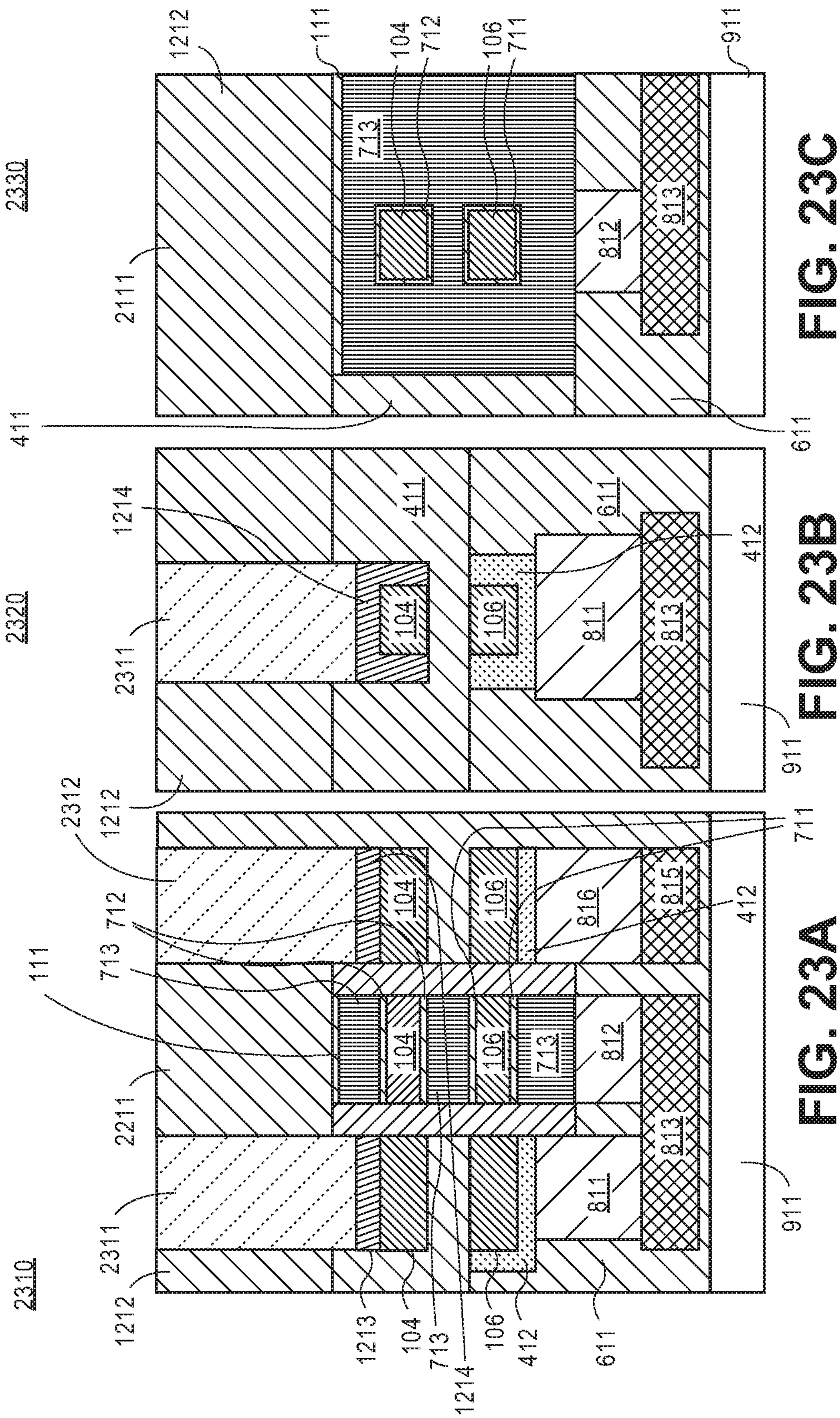
FIG. 23A is a view similar to FIG. 22A after conductive features are deposited onto source/drain regions according to another embodiment.
FIG. 23B is a view similar to FIG. 22B after conductive features are deposited onto source/drain regions according to another embodiment.
FIG. 23C is a view similar to FIG. 22C after conductive features are deposited onto source/drain regions according to another embodiment.

FIG. 23A is a view 2310 similar to FIG. 22A, FIG. 23B is a view 2320 similar to FIG. 22B, and FIG. 23C is a view 2330 similar to FIG. 22C after a conductive feature 2311 and a conductive feature 2312 are deposited onto source/drain regions 1213 and 1214 according to another embodiment. In one embodiment, each of the conductive features 2311 and 2312 is deposited as described above with respect to FIGS. 14A, 14B, and 14C.

Figures 24A, 24B, 24C:
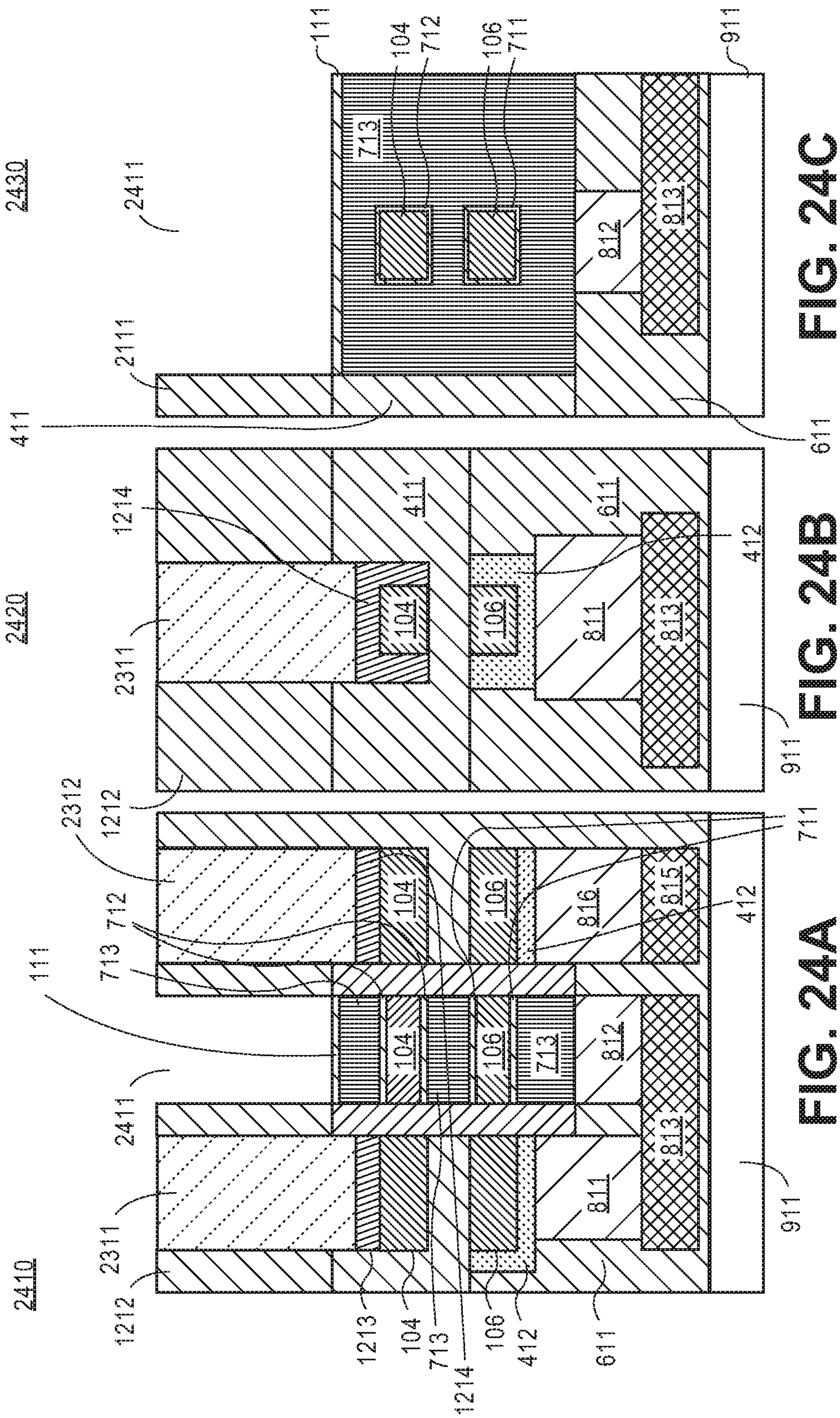
FIG. 24A is a view similar to FIG. 23A after an opening is formed in the insulating layer to expose a portion of the gate according to another embodiment.
FIG. 24B is a view similar to FIG. 23B after an opening is formed in the insulating layer to expose a portion of the gate according to another embodiment.
FIG. 24C is a view similar to FIG. 23C after an opening is formed in the insulating layer to expose a portion of the gate according to another embodiment.

FIG. 24A is a view 2410 similar to FIG. 23A, FIG. 24B is a view 2420 similar to FIG. 23B, and FIG. 24C is a view 2430 similar to FIG. 23C after an opening 2411 is formed in insulating layer 2211 to expose a portion of gate 713 according to another embodiment. In one embodiment, opening 2411 is formed using one of the patterning and etching techniques known to one of ordinary skill in the art of microelectronic device manufacturing.

Figures 25A, 25B, 25C:
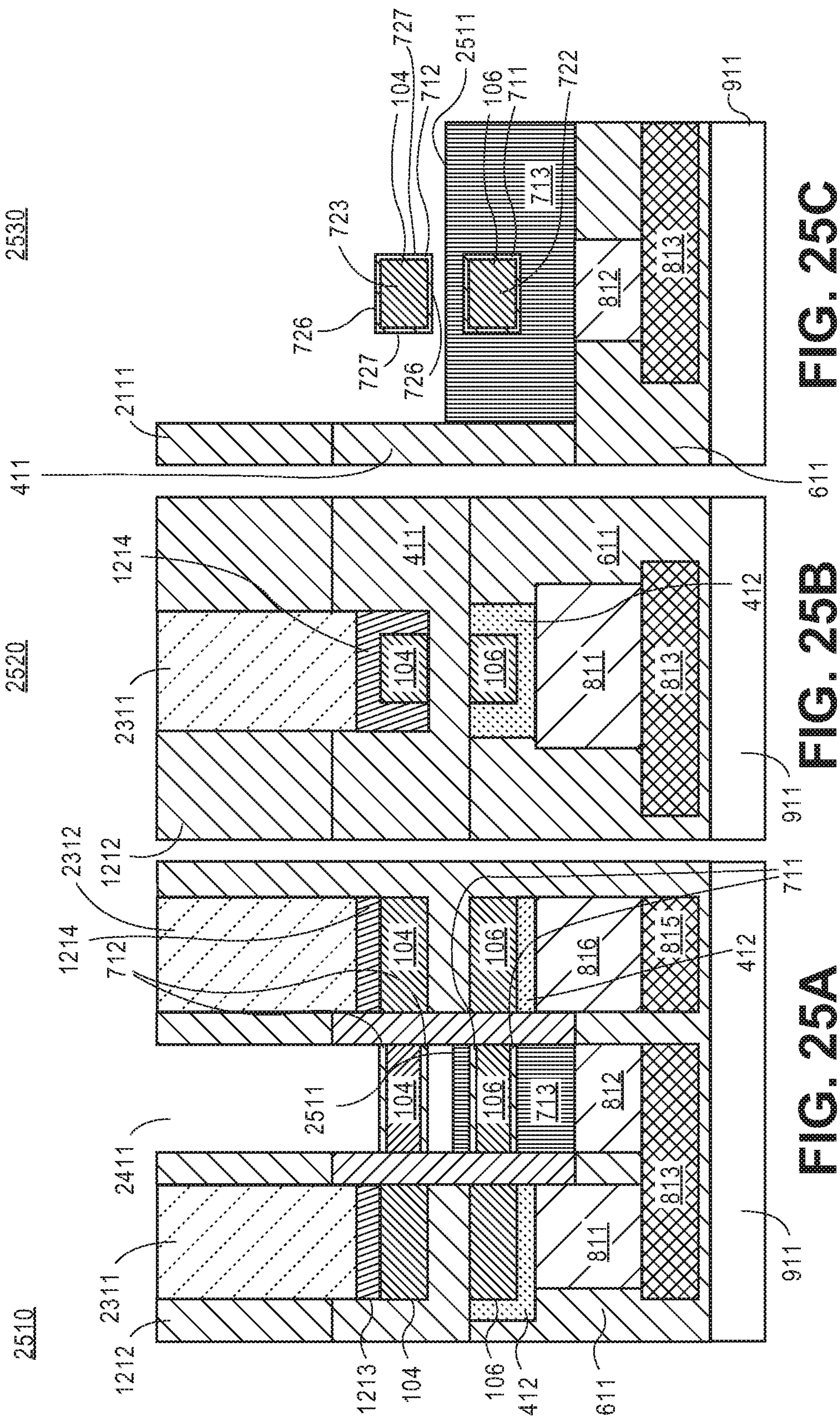
FIG. 25A is a view similar to FIG. 24A after a backside opening is formed according to another embodiment.
FIG. 25B is a view similar to FIG. 24B after a backside opening is formed according to another embodiment.
FIG. 25C is a view similar to FIG. 24C after a backside opening is formed according to another embodiment.

FIG. 25A is a view 2510 similar to FIG. 24A, FIG. 25B is a view 2520 similar to FIG. 24B, and FIG. 25C is a view 2530 similar to FIG. 24C after a backside opening 2411 in insulating layer 2211 is formed according to another embodiment. A portion of gate 713 is removed through the backside opening 2411 to expose a portion 2511 of metal gate 713. In one embodiment, opening 2411 is formed using one of the patterning and etching techniques known to one of ordinary skill in the art of microelectronic device manufacturing. In one embodiment, the portion of the gate 713 is removed to expose the oxide layer 712 on the sidewalls 726 and 727 of the gate portion 723 of the device layer 104. The oxide layer 711 on the gate portion 722 of the device layer 106 is underneath the portion 2511 of the metal gate 713.

Figures 26A, 26B, 26C:
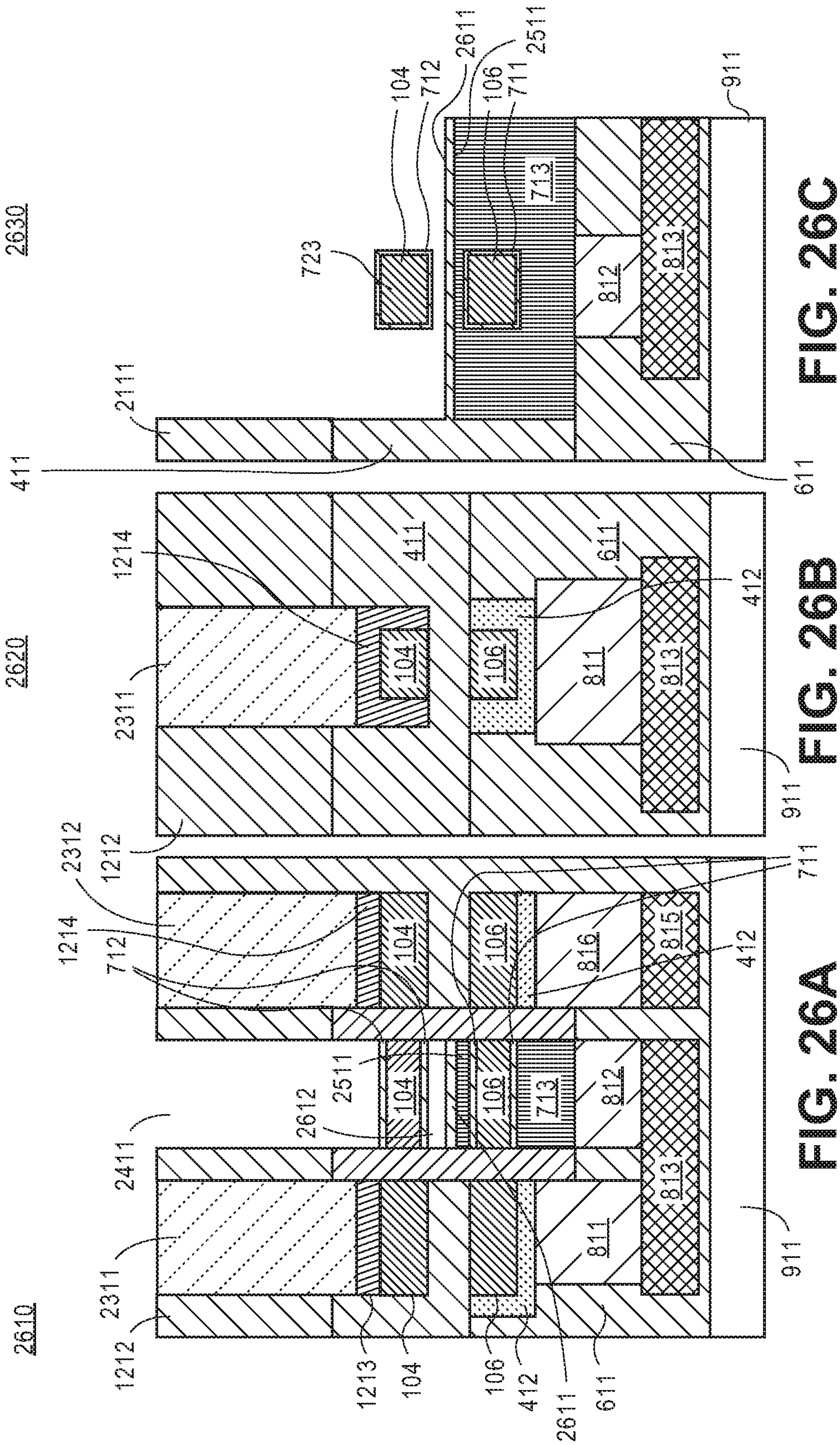
FIG. 26A is a view similar to FIG. 25A after an insulating layer is deposited according to another embodiment.
FIG. 26B is a view similar to FIG. 25B after an insulating layer is deposited according to another embodiment.
FIG. 26C is a view similar to FIG. 25C after an insulating layer is deposited according to another embodiment.

FIG. 26A is a view 2610 similar to FIG. 25A, FIG. 26B is a view 2620 similar to FIG. 25B, and FIG. 26C is a view 2630 similar to FIG. 25C after an insulating layer 2611 is deposited on portion 2511 of metal gate 713 according to another embodiment. In one embodiment, the insulating layer 2611 is one of the insulating layers described above. In more specific embodiment, the insulating layer 2611 is one of the oxide layers described above. In one embodiment, the thickness of the insulating layer 2611 is from about 2 angstroms (Å) to about 200 Å. In one embodiment, the insulating layer 2611 is deposited using one of the insulating layer deposition techniques described above, e.g., a spin-coating technique. In one embodiment, the insulating layer 2611 is recessed to form a gap 2612 between the insulating layer 2611 and oxide layer 712 on the bottom of the portion 723 of the device layer 104. In one embodiment, the insulating layer 2611 is recessed using one or more of the CMP and etching techniques, as described above.

Figures 27A, 27B, 27C:
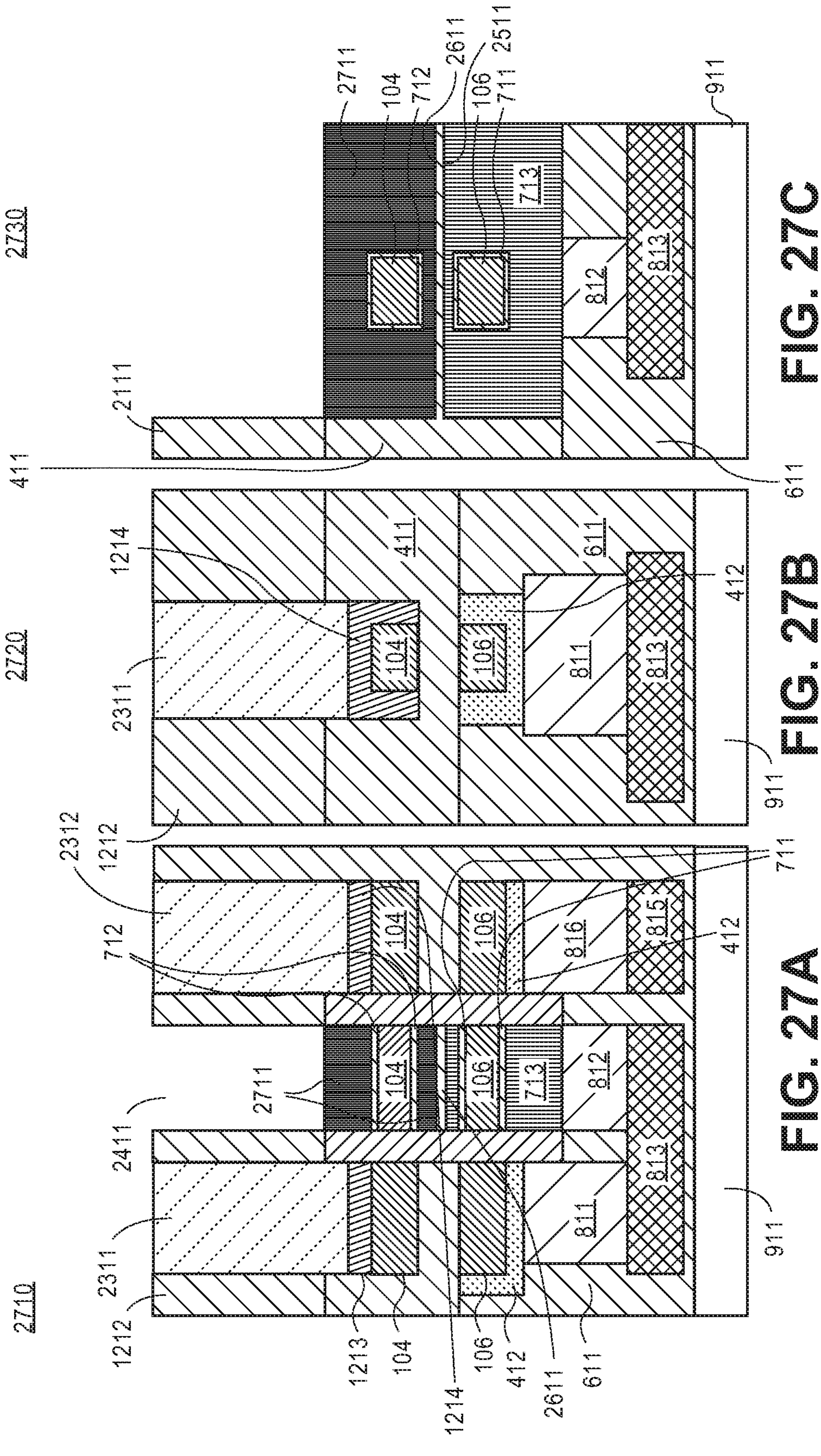
FIG. 27A is a view similar to FIG. 26A after a metal gate is deposited according to another embodiment.
FIG. 27B is a view similar to FIG. 26B after a metal gate is deposited according to another embodiment.
FIG. 27C is a view similar to FIG. 26C after a metal gate is deposited according to another embodiment.

FIG. 27A is a view 2710 similar to FIG. 26A, FIG. 27B is a view 2720 similar to FIG. 26B, and FIG. 27C is a view 2730 similar to FIG. 26C after a metal gate 2711 is deposited on insulating layer 2611 according to another embodiment. In another embodiment, the insulating layer 2611 is not deposited, and metal gate 2711 is deposited directly on portion 2511 of metal gate 713. In one embodiment, metal gate 2711 is represented by metal gate 714.

Figures 28A, 28B, 28C:
FIG. 28A is a view similar to FIG. 27A after a conductive feature is deposited according to another embodiment.
FIG. 28B is a view similar to FIG. 27B after a conductive feature is deposited according to another embodiment.
FIG. 28C is a view similar to FIG. 27C after a conductive feature is deposited according to another embodiment.

FIG. 28A is a view 2810 similar to FIG. 27A, FIG. 28B is a view 2820 similar to FIG. 27B, and FIG. 28C is a view 2830 similar to FIG. 27C after a conductive feature 2811 is deposited to contact metal gate 2711 according to another embodiment. In one embodiment, conductive feature 2811 is represented by conductive feature 1501.

Figure 29:
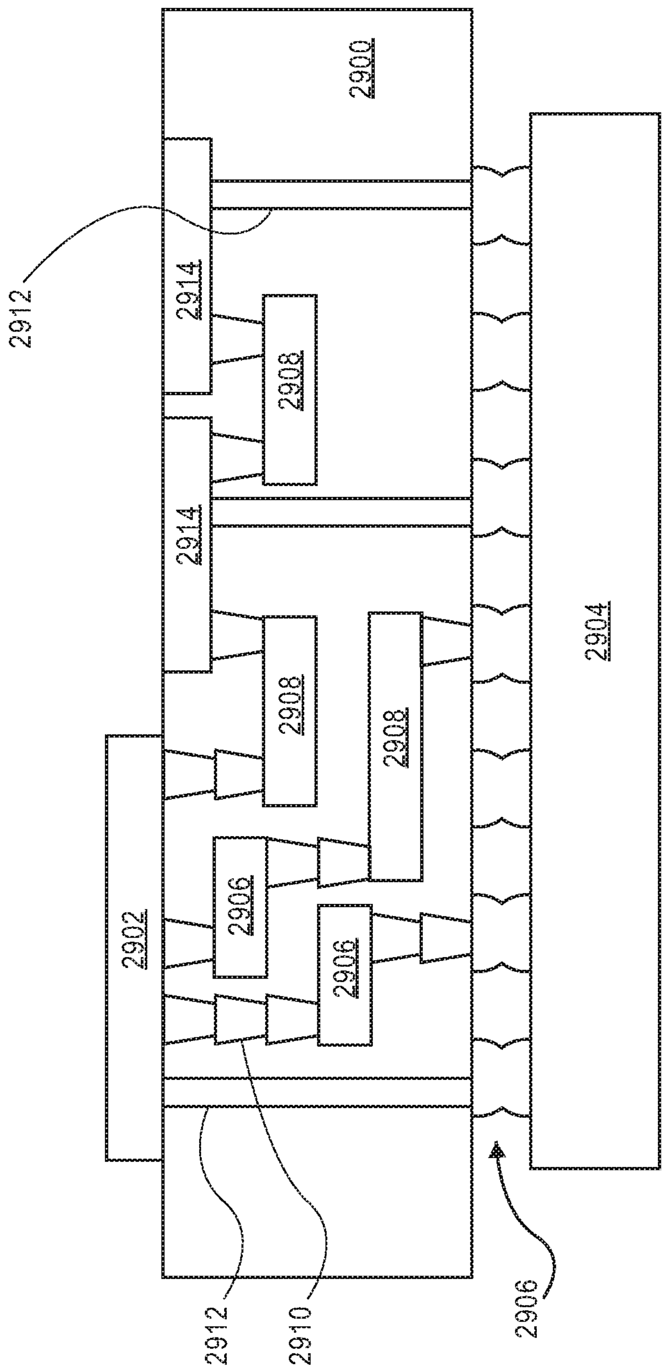
FIG. 29 illustrates an interposer that includes one or more embodiments of the invention.

FIG. 29 illustrates an interposer 2900 that includes one or more embodiments of the invention. The interposer 2900 is an intervening substrate used to bridge a first substrate 2902 to a second substrate 2904. The first substrate 2902 may be, for instance, an integrated circuit die. The second substrate 2904 may be, for instance, a memory module, a computer motherboard, or another integrated circuit die. Generally, the purpose of an interposer 2900 is to spread a connection to a wider pitch or to reroute a connection to a different connection. For example, an interposer 2900 may couple an integrated circuit die to a ball grid array (BGA) 2906 that can subsequently be coupled to the second substrate 2904. In some embodiments, the first and second substrates 2902/2904 are attached to opposing sides of the interposer 2900. In other embodiments, the first and second substrates 2902/2904 are attached to the same side of the interposer 2900. And in further embodiments, three or more substrates are interconnected by way of the interposer 2900.

The interposer 2900 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group and group IV materials.

The interposer may include metal interconnects 2908, vias 2910, including but not limited to through-silicon vias (TSVs) 2912. The interposer 2900 may further include embedded devices 2914, including passive and active devices. Such devices include, but are not limited to, stacked transistors or other stacked devices as described above, e.g., capacitors, decoupling capacitors, resistors, inductors, fuses, diodes, transformers, sensors, and electrostatic discharge (ESD) devices, radio-frequency (RF) devices, power amplifiers, power management devices, antennas, arrays, sensors and MEMS devices. In accordance with embodiments of the invention, apparatuses or processes disclosed herein may be used in the fabrication of interposer 2900.

Figure 30:
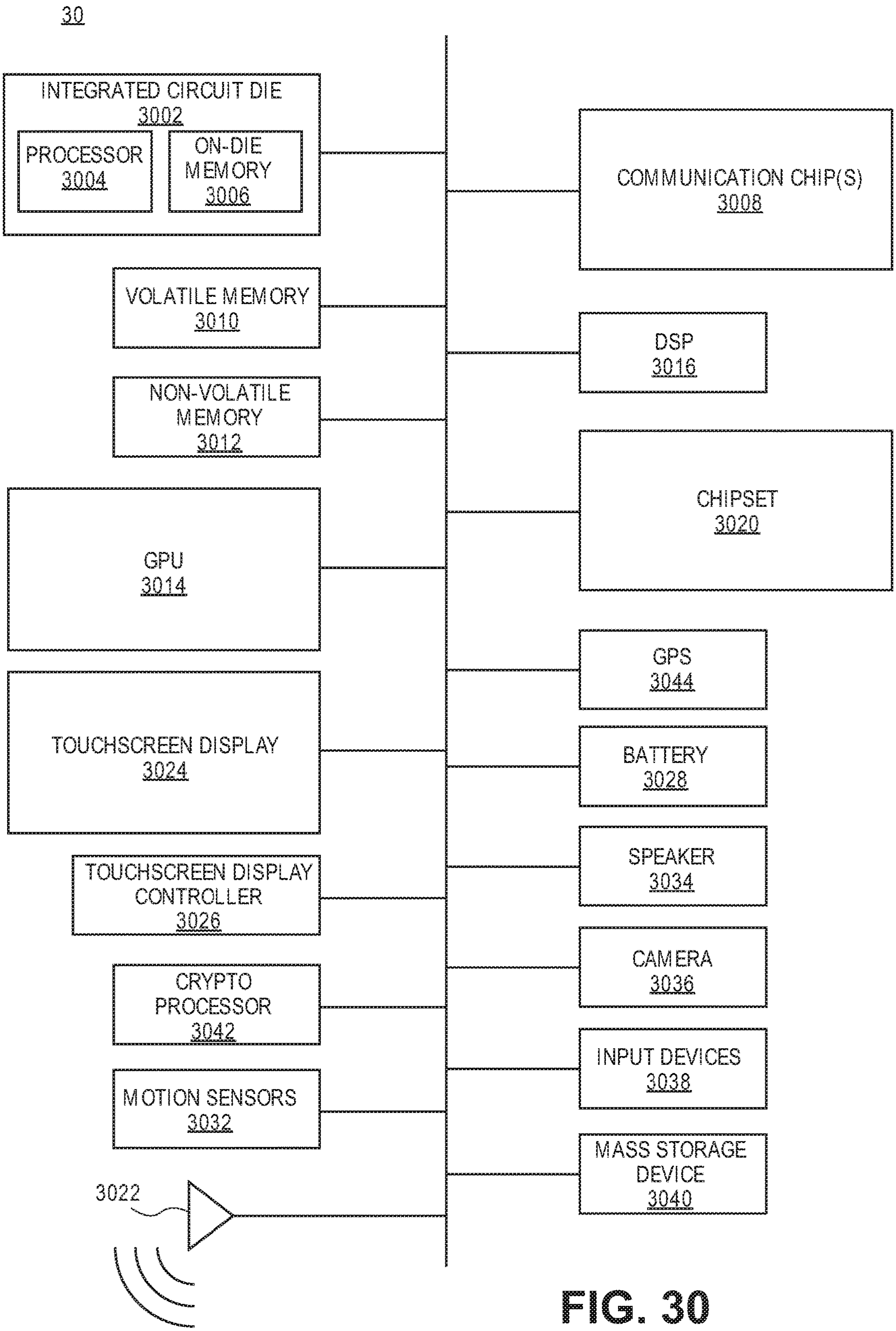
FIG. 30 illustrates a computing device in accordance with one embodiment of the invention.

FIG. 30 illustrates a computing device 3000 in accordance with one embodiment of the invention. The computing device 3000 may include a number of components. In one embodiment, these components are attached to one or more motherboards. In an alternate embodiment, these components are fabricated onto a single system-on-a-chip (SoC) die rather than a motherboard. The components in the computing device 3000 include, but are not limited to, an integrated circuit die 3002 and at least one communication chip 3008. In some implementations the communication chip 3008 is fabricated as part of the integrated circuit die 3002. The integrated circuit die 3002 may include a processor 3004 such as a central processing unit (CPU), an on-die memory 3006, often used as cache memory, that can be provided by technologies such as embedded DRAM (eDRAM) or spin-transfer torque memory (STTM or STTM-RAM).

Computing device 3000 may include other components that may or may not be physically and electrically coupled to the motherboard or fabricated within an SoC die. These other components include, but are not limited to, a volatile memory 3010 (e.g., DRAM), a non-volatile memory 3012

(e.g., ROM or flash memory), a graphics processing unit 3014 (GPU), a digital signal processor 3016 (DSP), a crypto processor 3042 (a specialized processor that executes cryptographic algorithms within hardware), a chipset 3020, an antenna 3022, a display or a touchscreen display 3024, a touchscreen display controller 3026, a battery 3028 or other power source, a global positioning system (GPS) device 3044, a power amplifier (PA), a compass, a motion coprocessor or sensors 3032 (that may include an accelerometer, a gyroscope, and a compass), a speaker 3034, a camera 3036, user input devices 3038 (such as a keyboard, mouse, stylus, and touchpad), and a mass storage device 3040 (such as hard disk drive, compact disk (CD), digital versatile disk (DVD), and so forth).

The communication chip 3008 enables wireless communications for the transfer of data to and from the computing device 3000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 3008 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 3000 may include a plurality of communication chips 3008. For instance, a first communication chip 3008 may be dedicated to shorter range wireless communications such as Wi-Fi and Bluetooth and a second communication chip 3008 may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory. One or more components e.g., integrated circuit die 3002, communication chip 3008, GPU 3014, cryptoprocessor 3042, DSP 3016, chipset 3020, and other components may include one or more stacked transistors, or other stacked devices formed in accordance with embodiments of the invention. In further embodiments, another component housed within the computing device 3000 may contain one or more stacked transistors, or other stacked devices formed in accordance with embodiments of the invention.

In various embodiments, the computing device 3000 may be a laptop computer, a netbook computer, a notebook computer, an ultrabook computer, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 3000 may be any other electronic device that processes data.

The above description of illustrated implementations of the invention, including what is described in the Abstract, is not intended to be exhaustive or to limit the invention to the precise forms disclosed. While specific implementations of, and examples for the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

The following examples pertain to further embodiments:

In one embodiment, a method to manufacture an electronic device comprises bonding a first interconnect layer to a first substrate, wherein the first interconnect layer is deposited on a first device layer on a second device layer on a second substrate; revealing the second device layer from the second substrate side; depositing a first insulating layer on the revealed second device layer; forming a first opening in the first insulating layer to expose a first portion of the second device layer; and forming a contact region on the exposed first portion of the second device layer.

In one embodiment, a method to manufacture an electronic device comprises bonding a first interconnect layer to a first substrate, wherein the first interconnect layer is deposited on a first device layer on a second device layer on a second substrate; revealing the second device layer from the second substrate side that comprises removing at least a portion of the second substrate; depositing a first insulating layer on the revealed second device layer; forming a first opening in the first insulating layer to expose a first portion of the second device layer; and forming a contact region on the exposed first portion of the second device layer.

In one embodiment, a method to manufacture an electronic device comprises bonding a first interconnect layer to a first substrate, wherein the first interconnect layer is deposited on a first device layer on a second device layer on a second substrate; revealing the second device layer from the second substrate side; depositing a first insulating layer on the revealed second device layer; forming a first opening in the first insulating layer to expose a first portion of the second device layer; forming a contact region on the exposed first portion of the second device layer; and depositing a conductive layer on the contact region.

In one embodiment, a method to manufacture an electronic device comprises bonding a first interconnect layer to a first substrate, wherein the first interconnect layer is deposited on a first device layer on a second device layer on a second substrate; revealing the second device layer from the second substrate side; depositing a first insulating layer on the revealed second device layer; forming a first opening in the first insulating layer to expose a first portion of the second device layer; and forming a contact region on the exposed first portion of the second device layer, wherein forming the contact region comprises depositing a doped layer on the exposed first portion.

In one embodiment, a method to manufacture an electronic device comprises bonding a first interconnect layer to a first substrate, wherein the first interconnect layer is deposited on a first device layer on a second device layer on a second substrate; revealing the second device layer from the second substrate side; depositing a first insulating layer on the revealed second device layer; forming a first opening in the first insulating layer to expose a first portion of the second device layer; and forming a contact region on the exposed first portion of the second device layer, wherein forming the contact region comprises depositing a doped layer on the exposed first portion; and annealing the doped layer.

In one embodiment, a method to manufacture an electronic device comprises bonding a first interconnect layer to a first substrate, wherein the first interconnect layer is deposited on a first device layer on a second device layer on a second substrate; revealing the second device layer from the second substrate side; depositing a first insulating layer on the revealed second device layer; forming a first opening in the first insulating layer to expose a first portion of the second device layer; and forming a contact region on the exposed first portion of the second device layer, wherein forming the contact region comprises depositing a doped layer on the exposed first portion, and removing the doped layer.

In one embodiment, a method to manufacture an electronic device comprises bonding a first interconnect layer to a first substrate, wherein the first interconnect layer is deposited on a first device layer on a second device layer on a second substrate; revealing the second device layer from the second substrate side; depositing a first insulating layer on the revealed second device layer; forming a first opening in the first insulating layer to expose a first portion of the second device layer; and forming a contact region on the exposed first portion of the second device layer, wherein forming the contact region comprises adding a dopant to the exposed first portion using an implantation technique.

In one embodiment, a method to manufacture an electronic device comprises bonding a first interconnect layer to a first substrate, wherein the first interconnect layer is deposited on a first device layer on a second device layer on a second substrate; revealing the second device layer from the second substrate side; depositing a first insulating layer on the revealed second device layer; forming a first opening in the first insulating layer to expose a first portion of the second device layer; forming a contact region on the exposed first portion of the second device layer; depositing a second insulating layer on the contact region; forming an opening in the second insulating layer to expose a portion of the contact region; and depositing a spacer layer onto a sidewall of the opening.

In one embodiment, a method to manufacture an electronic device comprises bonding a first interconnect layer to a first substrate, wherein the first interconnect layer is deposited on a first device layer on a second device layer on a second substrate; revealing the second device layer from the second substrate side; depositing a first insulating layer on the revealed second device layer; forming a first opening in the first insulating layer to expose a first portion of the second device layer; forming a contact region on the exposed first portion of the second device layer; depositing a second insulating layer on the contact region; forming an opening in the second insulating layer to expose a portion of the contact region; depositing a spacer layer onto a sidewall of the opening; etching the source/drain region to expose a portion the first interconnect layer; and depositing a conductive layer onto the exposed portion of the first interconnect layer.

In one embodiment, a method to manufacture an electronic device comprises bonding a first interconnect layer to a first substrate, wherein the first interconnect layer is deposited on a first device layer on a second device layer on a second substrate; revealing the second device layer from the second substrate side; depositing a first insulating layer on the revealed second device layer; forming a first opening in the first insulating layer to expose a first portion of the second device layer; forming a contact region on the exposed first portion of the second device layer; depositing a second insulating layer on the contact region; forming an opening in the second insulating layer to expose a portion of the contact region; depositing a spacer layer onto a sidewall of the opening; depositing a conductive layer onto the contact region; a second opening in the second insulating layer to expose a gate portion of the second device layer, the gate portion of the second device layer comprising a first metal layer.

In one embodiment, a method to manufacture an electronic device comprises bonding a first interconnect layer to a first substrate, wherein the first interconnect layer is deposited on a first device layer on a second device layer on a second substrate; revealing the second device layer from the second substrate side; depositing a first insulating layer on the revealed second device layer; forming a first opening in the first insulating layer to expose a first portion of the second device layer; forming a contact region on the exposed first portion of the second device layer; forming a second opening in the first insulating layer to expose a gate portion of the second device layer, the gate portion of the second device layer comprising a first metal layer; recessing the first metal layer to expose a gate portion of the first device layer; depositing a third metal layer onto the gate portion of the first device layer, wherein the third metal layer is different from the first metal layer; and depositing a conductive layer onto the third metal layer.

In one embodiment, a method to manufacture an electronic device comprises bonding a first interconnect layer to a first substrate, wherein the first interconnect layer is deposited on a first device layer on a second device layer on a second substrate; revealing the second device layer from the second substrate side; depositing a first insulating layer on the revealed second device layer; forming a first opening in the first insulating layer to expose a first portion of the second device layer; and forming a contact region on the exposed first portion of the second device layer; forming a second opening in the first insulating layer to expose a gate portion of the second device layer, the gate portion of the second device layer comprising a first metal layer; and depositing a third insulating layer on the exposed gate portion of the first device layer.

In one embodiment, a method to manufacture an electronic device comprises forming a fin on a first substrate, the fin comprising a first device layer on a second device layer, wherein a first intermediate layer is deposited between the first device layer and the second device, and wherein a first interconnect layer is deposited on the first device layer; bonding the first interconnect layer to a second substrate; removing the first substrate; depositing a first insulating layer on the revealed second device layer; forming a first opening in the first insulating layer to expose a first portion of the second device layer; and forming a contact region on the exposed first portion of the second device layer.

In one embodiment, a method to manufacture stacked transistors comprises forming a fin comprising a first transistor layer on a first intermediate layer on a second transistor layer on a backside substrate; forming a first source/drain region on the first transistor layer; forming an interconnect layer to connect to the source/drain region; bonding the interconnect layer to a carrier substrate; removing the backside substrate; and forming a second source/drain region on the second transistor layer.

In one embodiment, a method to manufacture stacked transistors comprises forming a fin comprising a first transistor layer on a first intermediate layer on a second transistor layer on a backside substrate; forming a first gate on the fin; forming a spacer on the first gate; forming a first source/drain region on the first transistor layer; replacing the first gate with a second gate; forming an interconnect layer to connect to the source/drain region; bonding the interconnect layer to a carrier substrate; removing the backside substrate; forming a second source/drain region on the second transistor layer.

In one embodiment, a method to manufacture stacked transistors comprises forming a fin comprising a first transistor layer on a first intermediate layer on a second transistor layer on a backside substrate; removing the first intermediate layer; forming a first source/drain region on the first transistor layer; forming an interconnect layer to connect to the source/drain region; bonding the interconnect layer to a carrier substrate; removing the backside substrate; and forming a second source/drain region on the second transistor layer.

In one embodiment, a method to manufacture stacked transistors comprises forming a fin comprising a first transistor layer on a first intermediate layer on a second transistor layer on a backside substrate; forming a first source/drain region on the first transistor layer; forming an interconnect layer to connect to the source/drain region; bonding the interconnect layer to a carrier substrate; removing the backside substrate; depositing an insulating layer on the second transistor layer; forming an opening in the insulating layer; forming a second source/drain region on the second transistor layer through the opening.

In one embodiment, a method to manufacture stacked transistors comprises forming a fin comprising a first transistor layer on a first intermediate layer on a second transistor layer on a backside substrate; forming a first source/drain region on the first transistor layer; forming an interconnect layer to connect to the source/drain region; bonding the interconnect layer to a carrier substrate; removing the backside substrate; forming a second source/drain region on the second transistor layer; depositing an insulating layer on the second transistor layer; forming an opening in the insulating layer; and depositing a spacer layer onto a sidewall of the opening In one embodiment, a method to manufacture stacked transistors comprises forming a fin comprising a first transistor layer on a first intermediate layer on a second transistor layer on a backside substrate; forming a first source/drain region on the first transistor layer; forming an interconnect layer to connect to the source/drain region; bonding the interconnect layer to a carrier substrate; removing the backside substrate; forming a second source/drain region on the second transistor layer; and depositing a conductive layer on the second source/drain region.

In one embodiment, a method to manufacture stacked transistors comprises forming a fin comprising a first transistor layer on a first intermediate layer on a second transistor layer on a backside substrate; forming a first source/drain region on the first transistor layer; forming an interconnect layer to connect to the source/drain region; bonding the interconnect layer to a carrier substrate; removing the backside substrate; and forming a second source/drain region on the second transistor layer, wherein forming the second source/drain region comprises depositing a doped layer.

In one embodiment, a method to manufacture stacked transistors comprises forming a fin comprising a first transistor layer on a first intermediate layer on a second transistor layer on a backside substrate; forming a first source/drain region on the first transistor layer; forming an interconnect layer to connect to the source/drain region; bonding the interconnect layer to a carrier substrate; removing the backside substrate; and forming a second source/drain region on the second transistor layer, wherein forming the second source/drain region comprises adding a dopant using an implantation technique.

In one embodiment, a method to manufacture stacked transistors comprises forming a fin comprising a first transistor layer on a first intermediate layer on a second transistor layer on a backside substrate; forming a first source/drain region on the first transistor layer; forming an interconnect layer to connect to the source/drain region; bonding the interconnect layer to a carrier substrate; removing the backside substrate; forming a second source/drain region on the second transistor layer; etching the second source/drain region to expose a portion the interconnect layer; and depositing a conductive layer onto the exposed portion of the first interconnect layer.

In one embodiment, a method to manufacture stacked transistors comprises forming a fin comprising a first transistor layer on a first intermediate layer on a second transistor layer on a backside substrate; forming a first source/drain region on the first transistor layer; forming an interconnect layer to connect to the source/drain region; bonding the interconnect layer to a carrier substrate; removing the backside substrate; forming a second source/drain region on the second transistor layer; depositing an insulating layer on the second transistor layer; forming an opening in the insulating layer to expose a gate portion of the second transistor layer; and depositing a conductive layer on the gate portion.

In one embodiment, an electronic device comprises a first transistor layer on a second transistor layer; a first interconnect layer to connect to a first source/drain region on the first transistor layer; a first gate on the first transistor layer; and a second interconnect layer to connect to a second source/drain region on the second transistor layer.

In one embodiment, an electronic device comprises a first transistor layer on a second transistor layer; a first interconnect layer to connect to a first source/drain region on the first transistor layer; a first gate on the first transistor layer; a second gate on the second transistor layer; and a second interconnect layer to connect to a second source/drain region on the second transistor layer.

In one embodiment, an electronic device comprises a first transistor layer on a second transistor layer; a first interconnect layer to connect to a first source/drain region on the first transistor layer; a first gate on the first transistor layer; and a second interconnect layer to connect to a second source/drain region on the second transistor layer, wherein a portion of the first interconnect layer is extended through the first source/drain region to connect to the second source/drain region.

In one embodiment, an electronic device comprises a first transistor layer on a second transistor layer; a first interconnect layer to connect to a first source/drain region on the first transistor layer; a first gate on the first transistor layer; and a second interconnect layer to connect to a second source/drain region on the second transistor layer, wherein a portion of the first interconnect layer wraps around the first source/drain region to connect to the second source/drain region.

In one embodiment, an electronic device comprises a first transistor layer on a second transistor layer; a first interconnect layer to connect to a first source/drain region on the first transistor layer; a first gate on the first transistor layer; and a second interconnect layer to connect to a second source/ drain region on the second transistor layer, wherein the first gate is on the second transistor layer.

In one embodiment, an electronic device comprises a first transistor layer on a second transistor layer; a first interconnect layer to connect to a first source/drain region on the first transistor layer; a first gate on the first transistor layer; and a second interconnect layer to connect to a second source/drain region on the second transistor layer, wherein the first gate comprises a metal.

In one embodiment, an electronic device comprises a first transistor layer on a second transistor layer; a first interconnect layer to connect to a first source/drain region on the first transistor layer; a first gate on the first transistor layer; a second interconnect layer to connect to a second source/drain region on the second transistor layer; and an insulating layer underneath the first gate.

In one embodiment, an electronic device comprises a first transistor layer on a second transistor layer; a first interconnect layer to connect to a first source/drain region on the first transistor layer; a first gate on the first transistor layer; and a second interconnect layer to connect to a second source/drain region on the second transistor layer, wherein the first transistor layer on the second transistor layer are a part of a fin.

In the foregoing specification, methods and apparatuses have been described with reference to specific exemplary embodiments thereof. It will be evident that various modifications may be made thereto without departing from the broader spirit and scope of embodiments as set forth in the following claims. The specification and drawings are, accordingly, to be regarded in an illustrative sense rather than a restrictive sense.

What is claimed is:

1. An electronic device comprising:

a first transistor layer on a second transistor layer;

a first interconnect layer coupled to a first source/drain region on the first transistor layer;

a first gate on the first transistor layer, the first gate having a first composition, wherein the first gate is an N-type gate;

a second interconnect layer coupled to a second source/drain region on the second transistor layer, the second interconnect layer having an uppermost surface; and a second gate on the second transistor layer, the second gate having a second composition different than the first composition, wherein the second gate is a P-type gate, and wherein the second gate is directly on the first gate, and wherein the second gate has a bottommost surface above the uppermost surface of the second interconnect layer.

2. The electronic device of claim 1, wherein a portion of the first interconnect layer is extended through the first source/drain region coupled to the second source/drain region.

3. The electronic device of claim 1, wherein a portion of the first interconnect layer wraps around the first source/drain region coupled to the second source/drain region.

4. The electronic device of claim 1, further comprising an insulating layer underneath the first gate.

5. A computing device, comprising:

a board; and a component coupled to the board, the component including an integrated circuit structure, comprising:

a first transistor layer on a second transistor layer;

a first interconnect layer coupled to a first source/drain region on the first transistor layer;

a first gate on the first transistor layer, the first gate having a first composition, wherein the first gate is an N-type gate;

a second interconnect layer coupled to a second source/drain region on the second transistor layer, the second interconnect layer having an uppermost surface; and a second gate on the second transistor layer, the second gate having a second composition different than the first composition, wherein the second gate is a P-type gate, and wherein the second gate is directly on the first gate, and wherein the second gate has a bottommost surface above the uppermost surface of the second interconnect layer.

6. The computing device of claim 5, further comprising: a memory coupled to the board.

7. The computing device of claim 5, further comprising: a communication chip coupled to the board.

8. The computing device of claim 5, further comprising: a camera coupled to the board.

9. The computing device of claim 5, further comprising: a battery coupled to the board.

10. The computing device of claim 5, further comprising: an antenna coupled to the board.

11. The computing device of claim 5, wherein the component is a packaged integrated circuit die.

12. The computing device of claim 5, wherein the component is selected from the group consisting of a processor, a communications chip, and a digital signal processor.

13. The computing device of claim 5, wherein the computing device is selected from the group consisting of a mobile phone, a laptop, a desk top computer, a server, and a set-top box.

14. The computing device of claim 5, wherein a portion of the first interconnect layer is extended through the first source/drain region coupled to the second source/drain region.

15. The computing device of claim 5, wherein a portion of the first interconnect layer wraps around the first source/drain region coupled to the second source/drain region.

16. The computing device of claim 5, further comprising an insulating layer underneath the first gate.

17. An electronic device comprising:

a first transistor layer on a second transistor layer;

a first interconnect layer coupled to a first source/drain region on the first transistor layer;

a first gate on the first transistor layer;

a second interconnect layer coupled to a second source/drain region on the second transistor layer, the second interconnect layer having an uppermost surface; and a second gate on the second transistor layer, the second gate having a material layer not included in the first gate, wherein the second gate is directly on the first gate, and wherein the second gate has a bottommost surface above the uppermost surface of the second interconnect layer.

18. An electronic device comprising:

a first transistor layer on a second transistor layer;

a first interconnect layer coupled to a first source/drain region on the first transistor layer;

a first gate on the first transistor layer, the first gate having a first composition;

a second interconnect layer coupled to a second source/drain region on the second transistor layer, the second interconnect layer having an uppermost surface; and a second gate on the second transistor layer, the second gate having a second composition, an entirety of the second composition different than an entirety of the first composition, wherein the second gate is directly on the first gate, and wherein the second gate has a bottommost surface above the uppermost surface of the second interconnect layer.

19. An electronic device comprising:

a first transistor layer on a second transistor layer;

a first interconnect layer coupled to a first source/drain region on the first transistor layer;

a first gate on the first transistor layer;

a second interconnect layer coupled to a second source/drain region on the second transistor layer, the second interconnect layer having an uppermost surface; and a second gate on the second transistor layer, wherein the second gate is directly on the first gate, and wherein the second gate meets the first gate at a physical interface, and wherein the second gate has a bottommost surface above the uppermost surface of the second interconnect layer.

* * * * *